United States Patent [19] [11] Patent Number: 4,835,782
Kaede et al. [45] Date of Patent: May 30, 1989

[54] METHOD AND APPARATUS FOR AN OSCILLATION FREQUENCY SEPARATION AMONG A PLURALITY OF LASER DEVICES

[75] Inventors: Kazuhisa Kaede; Naoki Shimosaka, both of Tokyo, Japan

[73] Assignee: NEC Corporation, Tokyo, Japan

[21] Appl. No.: 200,098

[22] Filed: May 31, 1988

[30] Foreign Application Priority Data

May 29, 1987 [JP] Japan .................. 62-137269
Jul. 13, 1987 [JP] Japan .................. 62-175102
Oct. 15, 1987 [JP] Japan .................. 62-260932
Jan. 29, 1988 [JP] Japan .................. 63-20600
Jan. 29, 1988 [JP] Japan .................. 63-20603
Mar. 25, 1988 [JP] Japan .................. 63-72332

[51] Int. Cl.$^4$ ............................................. H01S 3/13
[52] U.S. Cl. ........................... 372/32; 372/28; 372/38
[58] Field of Search ............ 372/24, 32, 29, 33, 372/28, 38, 9, 26

[56] References Cited

U.S. PATENT DOCUMENTS 4,322,836  3/1982  Kinjo et al. ................ 360/77
4,530,097  7/1985  Stokes et al. .............. 372/94
4,707,061 11/1987  McMahon ................. 350/96.16

OTHER PUBLICATIONS

Mathews et al; "Packaged Freq.-Stable Tunable 20 kHz Linewidth 1.5 μm InGaAlP External Cavity Laser"; Electronics Lett. vol. 21, No. 3, 1/31/85.
Part 2, National Conference Record, 1986, The Institute of Electronics and Communication Engineers of Japan, p. 2-204.
Technical Digest, vol. III, 5th Int'l Conference on Integrated Optics and Optical Fiber Communication, Oct. 1-4, 1985, pp. 61-64.
Electronics Letters, Apr. 9, 1987, vol. 23, No. 8, pp. 403-405.
12th European Conference on Optical Communication, Technical Digest, vol. 1, Sep. 22/25, 1986, pp. 29-32.

Primary Examiner—Léon Scott, Jr.
Attorney, Agent, or Firm—Sughrue, Mion, Zinn, Macpeak & Seas

[57] ABSTRACT

There are disclosed a method and apparatus for stabilizing an oscillation frequency separation among a plurality of laser devices wherein a plurality of laser devices are controlled to radiate output lights each having a predetermined frequency so that a frequency separation is stabilized. Reference pulses are produced in an optical resonator which has periodic resonant frequencies and receives a frequency sweep signal, and beat signals are produced in accordance with the combination of the frequency sweep signal and oscillation frequencies of the plurality of laser devices. The reference signals and beat signals thus produced are processed to produce error signals which are time differences between the producing times of the both signals. The plurality of laser devices are controlled to be driven such that the error signals become a predetermined value.

10 Claims, 18 Drawing Sheets

201 ACTIVE REGION
202 PC REGION
203 DBR REGION

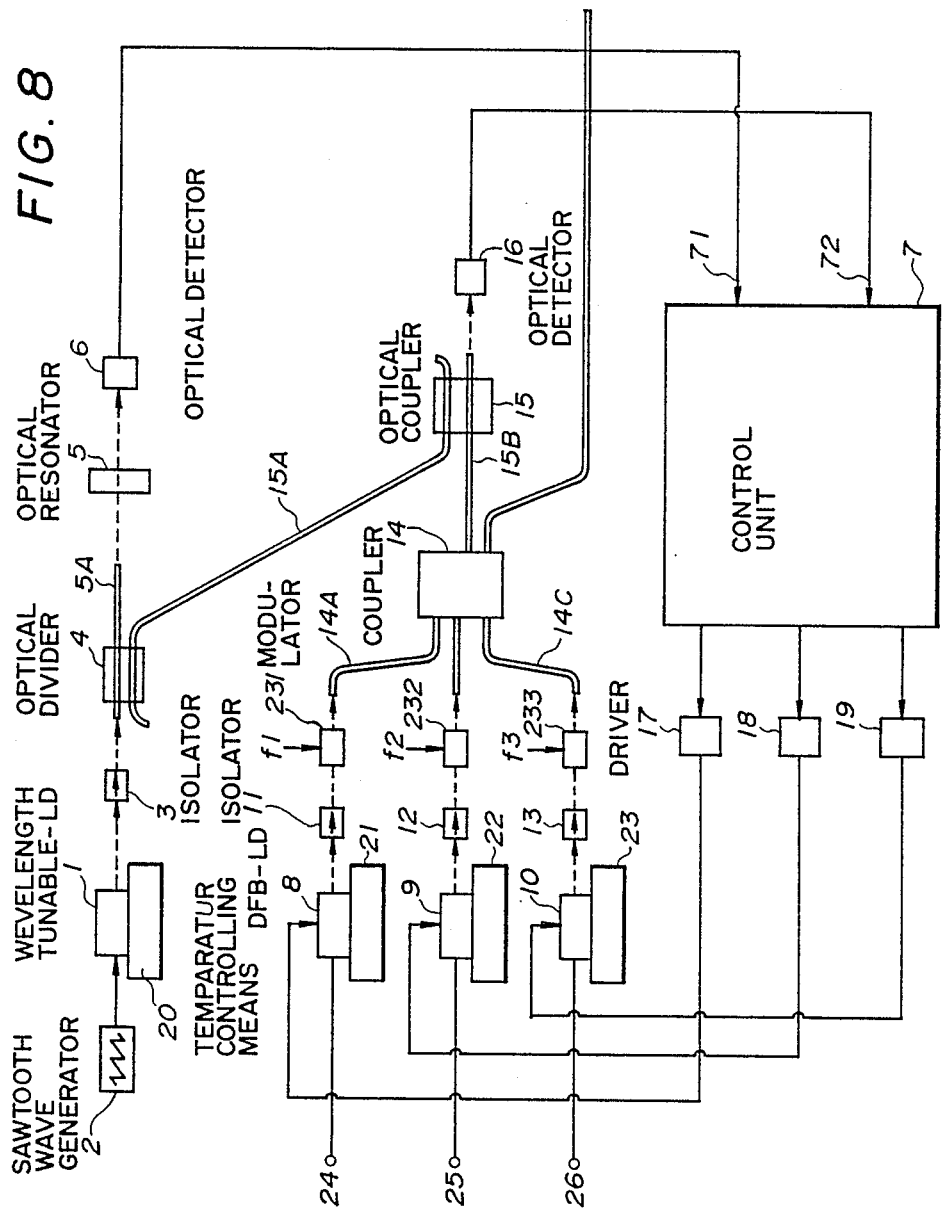

METHOD AND APPARATUS FOR AN OSCILLATION FREQUENCY SEPARATION AMONG A PLURALITY OF LASER DEVICES

FIELD OF THE INVENTION

The invention relates to a method and apparatus for stabilizing an oscillation frequency separation among a plurality of laser devices, and more particularly to a method and apparatus for stabilizing an oscillation frequency separation among a plurality of laser devices which are applied to an optical communication system in which light signals are transmitted using optical frequency division multiplexing with a high density of frequencies thereby remarkably increasing transmission capacity.

BACKGROUND OF THE INVENTION

A conventional method for stabilizing oscillation frequency separation among a plurality of laser devices has been described on page 2-204 of "Part 2, National Conference Record, 1986, The Institute of Electronics and Communication Engineers of Japan". In the method for stabilizing an oscillation frequency separation among a plurality of laser devices, an oscillation frequency of a laser device selected from a plurality of laser devices is stabilized based on a resonant frequency of a sweep type Fabry Perot optical resonator. Oscillation frequencies of the remaining laser devices which are observed through the Fabry Perot optical resonator are stabilized to be provided with a predetermined separation based on the oscillation frequency of the selected laser device.

Another conventional method for stabilizing an oscillation frequency separation among a plurality of laser devices has been described on pages 61 to 64 of "Technical digest, Vol. III, 5th International Conference on Integrated Optics and Optical Fiber Communication, Oct. 1 to 4, 1985". In the method for stabilizing an oscillation frequency separation among a plurality of laser devices, a plurality of laser devices in which an oscillation frequency of a selected laser device is stabilized are driven to radiate output lights with respective frequencies, while an oscillation frequency sweep laser device is driven to radiate a sweep frequency output light in accordance with a sawtooth sweep signal. The output lights radiated from the plurality of laser devices are coupled with the sweep frequency output light radiated from the oscillation frequency sweep laser device to produce beat signals which are then converted to a train of pulse signals. The plurality of laser devices are controlled such that producing times of the pulse signals are of respective predetermined separations as compared to a producing time of a pulse signal which is produced on the basis of output light radiated from the selected laser device having a stabilized oscillation frequency. As a result, the plurality of laser devices are stabilized to radiate output lights among which oscillation frequencies are maintained to have a predetermined separation.

According to the former method for stabilizing an oscillation frequency separation among a plurality of laser devices, however, there are disadvantages that the number of laser devices which are controlled to be stabilized in a frequency separation is limited less than ten to twenty for the reason why the Fabry Perot optical resonator is used therein to detect an oscillation frequency separation so that the number of the laser devices to be controlled depends on a finesse of the Fabry Perot optical resonator, and that a mechanical stabilization is low because a mechanical sweep operation is inevitable therein.

According to the latter method for stabilizing an oscillation frequency separation among a plurality of laser devices, further, there are disadvantages that a frequency separation must be set therein in accordance with a frequency separation reference which is specified beforehand because a frequency separation reference signal is not produced therein, that a predetermined frequency separation is difficult to be maintained for a long time due to the time degradation etc. of the oscillation frequency sweeping laser device for the reason why the frequency separation reference is determined on the basis of a relation between the producing times of the pulse signals obtained from the aforementioned beat signals and voltages applied at the producing times to the plurality of laser devices, and that a target applying voltage must be set for a new laser device each time in a case where one of the laser devices is involved in a trouble and replaced by the new laser device.

SUMMARY OF THE INVENTION

Accordingly, it is an object of the invention to provide a method and apparatus for stabilizing an oscillation frequency separation among a plurality of laser devices in which the number of laser devices to be controlled is not limited.

It is a further object of the invention to provide a method and apparatus for stabilizing an oscillation frequency separation among a plurality of laser devices in which a mechanical stabilization thereof is increased.

It is a still further object of the invention to provide a method and apparatus for stabilizing an oscillation frequency separation among a plurality of laser devices in which a frequency separation reference signal is produced therein.

It is a yet still further object of the invention to provide a method and apparatus for stabilizing an oscillation frequency separation among a plurality of laser devices in which an oscillation frequency separation is stabilized without depending on a relation between voltages applied to sweep LDs and oscillation frequencies based on the applied voltages.

According to one feature of the invention, a method for stabilizing an oscillation frequency separation among a plurality of laser devices comprises, sweeping an oscillation frequency of a laser device to which an external signal is applied to radiate an oscillation frequency sweep output light, driving a plurality of laser devices to radiate output lights with oscillation frequencies in a frequency range of said oscillation frequency sweep output light, combining said oscillation frequency sweep output light and said output lights with oscillation frequencies to produce combined light signals which are then converted to electric signals, a low frequency component of said electric signals being filtered to produce a train of beat pulse corresponding to said oscillation frequencies of said plurality of laser devices, passing a part of said oscillation frequency sweep output light through an optical resonator having periodic resonant frequencies to produce reference output lights of said periodic resonant frequencies which are then converted to electric reference pulses, an interval of said periodic resonant frequencies being equal to a predetermined oscillation frequency separation among said plurality of laser devices, comparing producing times of said beat pulses and those of said reference pulses to produce error signals corresponding to time differences therebetween, and controlling oscillation frequencies of said plurality of laser devices such that said error signals are approximately equal to a predetermined value.

According to another feature of the invention, an apparatus for stabilizing an oscillation frequency separation among a plurality of laser devices comprises, a laser device to which an oscillation frequency sweep signal is applied in a frequency range including oscillation frequencies of a plurality of laser devices to be controlled, an optical divider for dividing output light of said laser device into at least two output lights, a first optical coupler for combining output lights of said plurality of laser devices, a second optical coupler for combining one of said at least two output lights and output lights which are combined in said first optical coupler, an optical resonator through which the other one of said at least two output lights is passed to produce transmission lights of intensity levels corresponding to transmission curve thereof in accordance with a frequency variation thereof so that reference output lights are supplied therefrom, means for converting said reference output lights to electric reference pulses, means for converting a combined output light obtained in said second optical coupler to electric signal, a low-pass filter through which a low frequency component of said electric signal is passed to produce beat pulses corresponding to said oscillation frequencies of said plurality of laser devices, means for producing error signals in accordance with the difference of producing times between said reference pulses and said beat pulses, and means for controlling said plurality of laser devices to be driven in accordance with said error signals such that said error signals become a predetermined value.

BRIEF DESCRIPTION OF THE DRAWINGS

The invention will be explained in more detail in conjunction with appended drawings wherein, FIG. 8 is a block diagram showing a second embodiment according to the invention.

DESCRIPTION OF PREFERRED EMBODIMENTS

Figure 1:
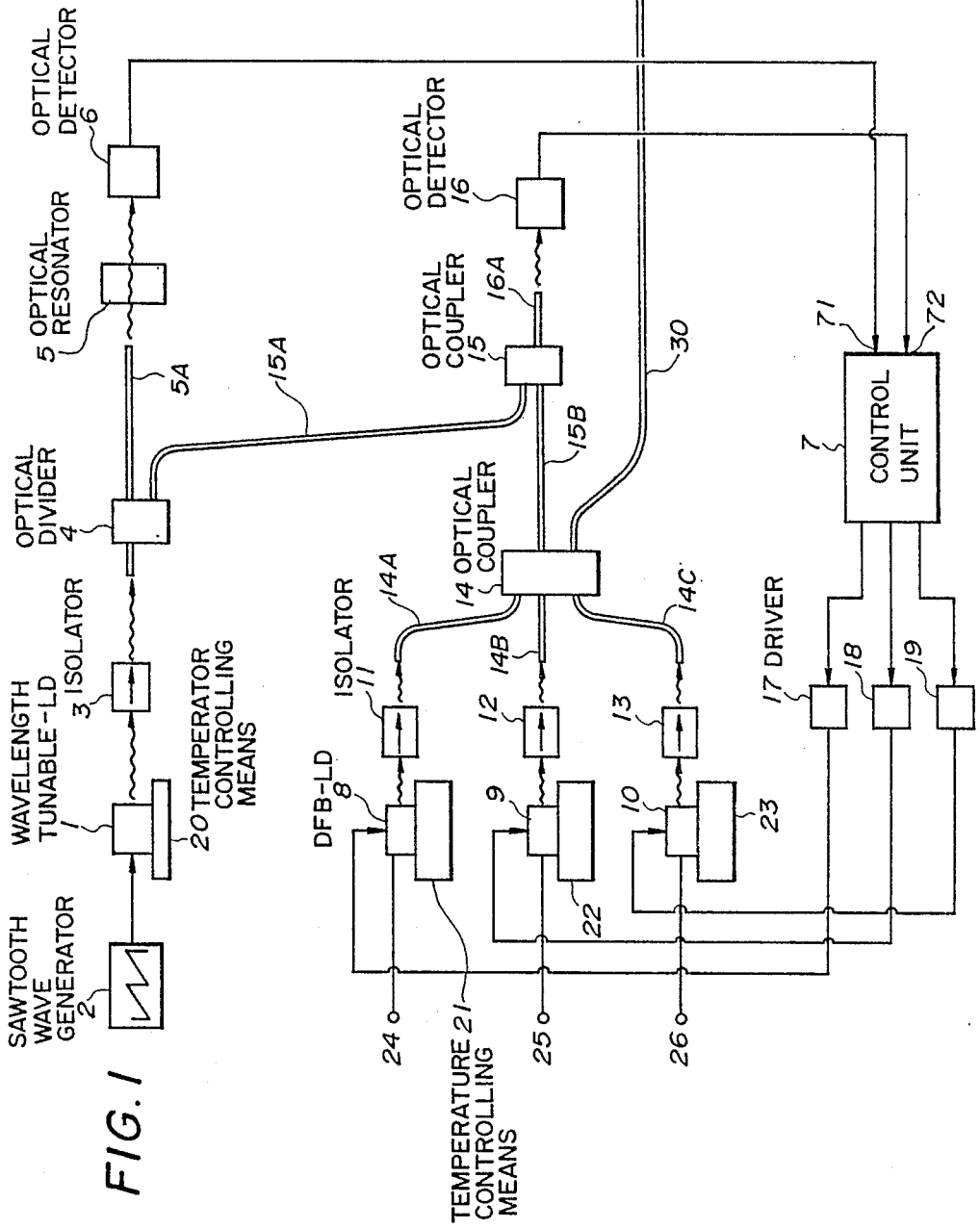
FIG. 1 is a block diagram showing a first embodiment according to the invention.

FIG. 1 shows an apparatus for stabilizing an oscillation frequency separation among a plurality of laser devices which comprises a distributed Bragg reflector type of a 1.55 m band wavelength tunable Double Channeled-Planar Buried Heterostructure semiconductor laser device 1 (simply called "a wavelength tunable laser device" hereinafter), a sawtooth wave generator 2 from which a sawtooth wave current is injected into a phase control (PC) region and a DBR region of the wavelength tunable laser device 1, an isolator 3 through which output light of the wavelength tunable laser device 1 is passed, an optical divider 4 for dividing the output light into two output lights which are propagated through optical fibers 5A and 15A, a Fabry Perot optical resonator 5 having three resonant frequencies (equal to the number of the laser devices 8, 9 and 10) through which output light supplied from the optical fiber 5A is passed to produce three light pulses in one period of the sawtooth wave of the generator 2 based on the three resonant frequencies, a first optical detector 6 for converting the three light pulses supplied from the optical resonator 5 to three electric signals, 1.55 μm band distributed feedback type laser devices 8, 9 and 10 with modulation signal input terminals 24, 25 and 26 (simply called "DFB-LD" hereinafter) among which an oscillation frequency separation is stabilized and each being modulated in a frequency shift keying with a modulation rate of 400 Mb/S and a modulation index of 2.5, optical isolators 11, 12 and 13 through which output lights of the DFB-LDs 8, 9 and 10 are passed to be propagated through optical fibers 14A, 14B and 14C, an optical coupler 14 for combining the output lights propagated through the optical fibers 14A, 14B and 14C and for dividing the output lights thus combined into output lights which are propagated through an optical fiber 15B and an optical fiber transmission line 30, a second optical coupler 15 for combining the output lights propagated through the optical fibers 15A and 15B, a second optical detector 16 for converting the output light thus combined in the second optical coupler 15 and propagated through an optical fiber 16 to electric signals, a control unit 7 for producing error signals in accordance with the electric signals received at input terminals 71 and 72, laser device driving means 17, 18 and 19 for driving the DFB-LDs 8, 9 and 10 to stabilize an oscillation frequency separation thereof, and temperature controlling means 20, 21, 22 and 23 on which the wavelength variable laser device 1, and the DFB-LDs 8, 9 and 10 are mounted respectively.

Figure 2:
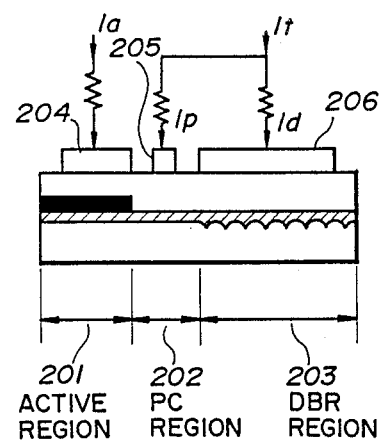
FIG. 2 is an explanatory view showing a wavelength tunable laser device used in the first embodiment.

The wavelength tunable laser device 1 has been described in detail on pages 403 to 405 of "Electronics letters, 9th April 1987, Vol, 23, No. 8". As shown in FIG. 2, the wavelength tunable laser device 1 comprises an active region 201, a PC (phase control) region 202, and a DBR (distributed Braggy reflector) region 203 into which currents $I_a$, $I_p$ and $I_d$ are injected through respective electrodes 204, 205 and 206. The current $I_a$ injected into the active region 201 is mainly a current for oscillating the wavelength tunable laser device 1, while the currents $I_p$ and $I_d$ (divided dependent on respective resistance values from a total current $I_t$) are mainly currents for tuning an oscillation wavelength thereof.

The Fabey-Perot optical resonator 5 has been described in detail in Chapter 4 of "Optical electronics, 1985, authored by Ammon Yariv" published by Halt, Rinehart and Winston Inc. In the embodiment, etalon plate made of quartz glass and having a refractive index of 1.5, a thickness of 1 cm and a finesse of 30 is used for the optical resonator 5. The finesse is defined by a ratio of an optical resonant frequency separation in regard to a full width at half maximum of an optical pass-band in the center of an optical resonant frequency.

Figure 3:
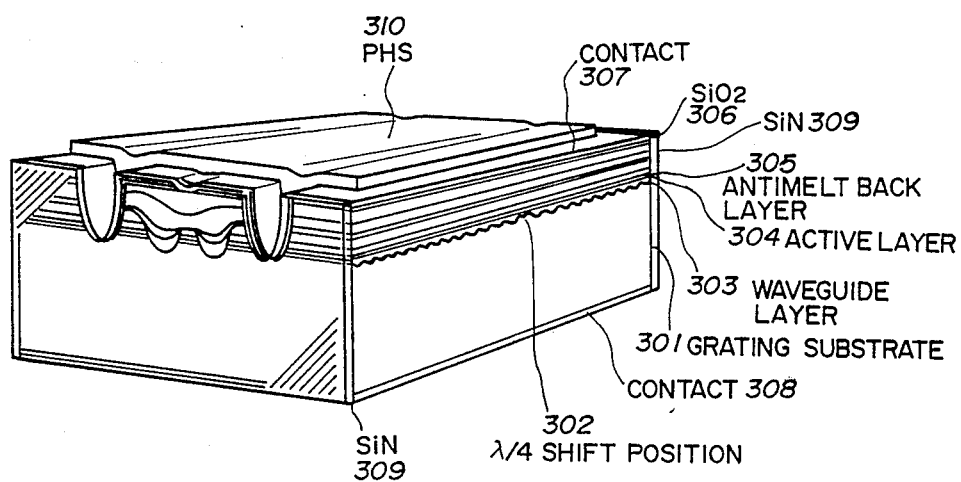
FIG. 3 is a perspective view showing a DFB-LD used in the first embodiment.

One of the DFB-LD 8, 9 and 10 has been described in detail in the report entitled "Highly stable single longitudinal mode operation in λ/4 shift 1.5 μm DFB-DCPBH LDs" on pages 29 to 32 of "12th European Conference on Optical Communication, Technical Digest, Vol. 1, September 22/25, 1986". As shown in FIG. 3, the laser device comprises a first order InP grating substrate 301 including a λ/4 shift position 302, a waveguide layer 303, an active layer 304, an anti-meltback layer 305, and a $SiO_2$ film 306, and further comprises contacts 307 and 308 respectively provided on the top surface of layers sequentially grown on the grating substrate 301 and the back surface thereof, SiN films 309 provided on both side facets thereof, and a PHS layer 310 provided on the contact 307.

Figure 4:
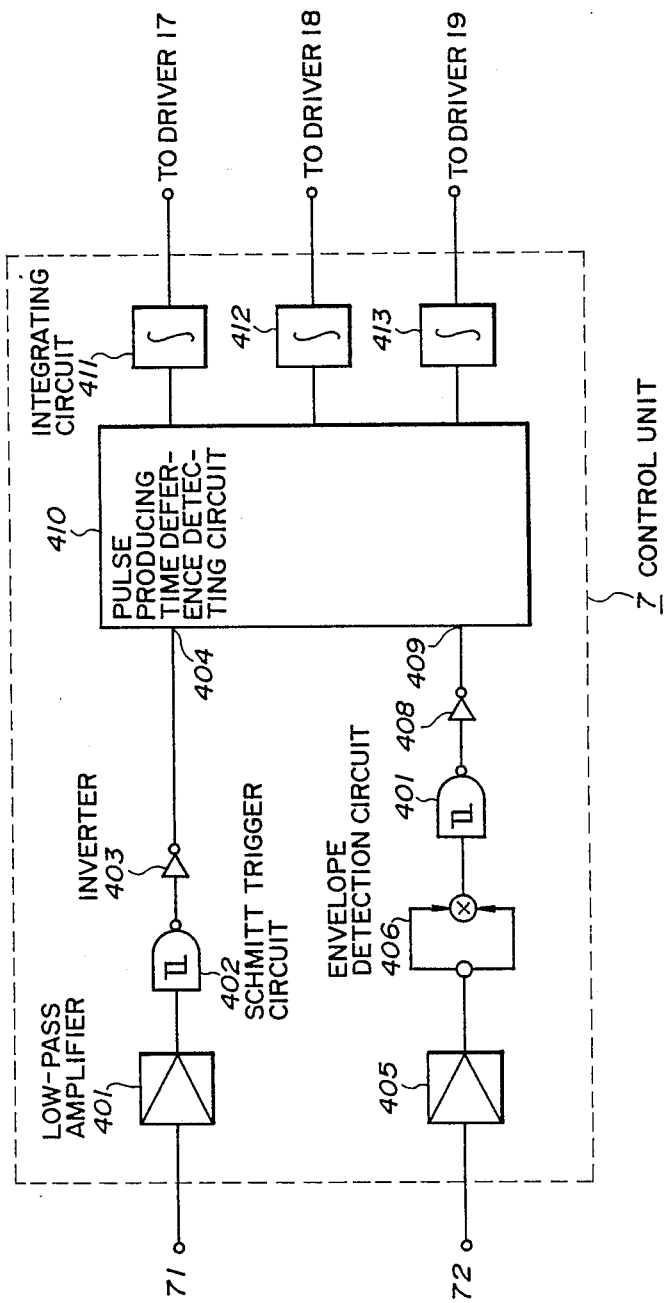
FIG. 4 is a block diagram showing a control unit in the first embodiment.

FIG. 4 shows the control unit 7 which is briefly described in FIG. 1. The control unit 7 comprises a low-pass amplifier 401 for amplifying electric signals of pulses received through the terminal 71 from the optical detector 6, a Schmitt trigger circuit 402 for producing logic signals each having a predetermined logic level in accordance with the outputs of the low-pass amplifier 401, an inverter 403 for inverting the logic signals, a low-pass amplifier 405 with a cut-off frequency of 600 MHz and a function of a low-pass filter for producing electric signals which are called to be "beat pulses" when the frequency difference of the output lights between the wavelength tunable laser device 1 and the DFB-LDs 8, 9 and 10 is in the range of approximately ±600 MHz, an envelope detector 406 in which the beat pulses are subject to an envelope detection, a Schmitt trigger circuit 407 for producing logic signals in accordance with the outputs of the envelope detector 406, and an inverter 408 for inverting the logic signals, a circuit 410 for detecting the difference of pulse producing times between the reference pulses and the beat pulses in accordance with the logic signals received at terminals 404 and 409 thereof, and integrating circuits 411, 412 and 413 for integrating a pulse producing time difference which is detected in the circuit 410 to be supplied to the aforementioned drivers 17, 18 and 19.

Figure 5:
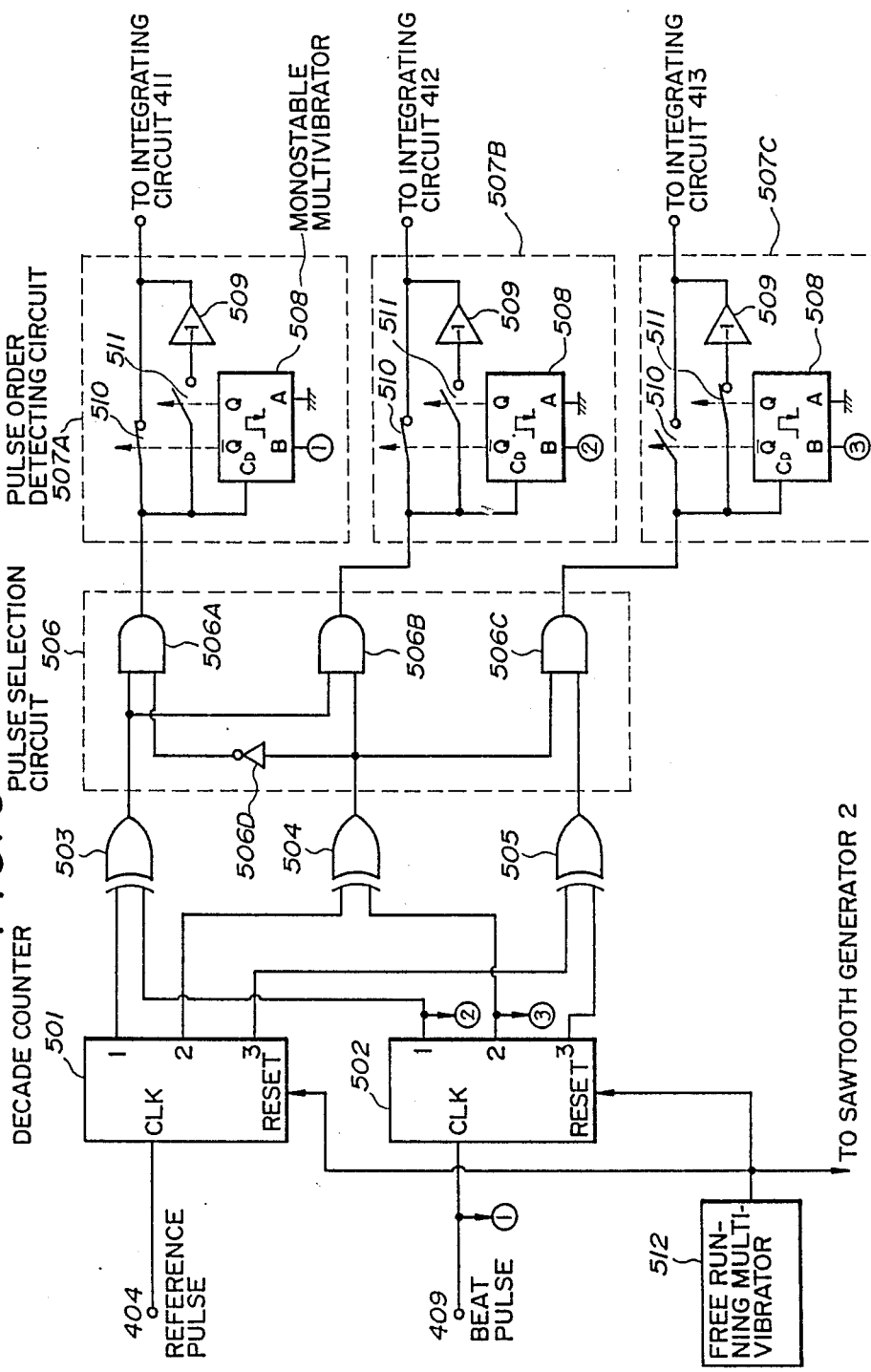
FIG. 5 is a circuit diagram showing a circuit for detecting the difference of pulse producing times in the first embodiment.

FIG. 5 shows the circuit 410 for detecting the pulse producing time difference which comprises a first decade counter 501 having a CLK input terminal for receiving the reference pulses at the terminal 404, and three output terminals 1 to 3 from which a series of square waves each becoming "high" by a reference pulse and "low" by a following reference pulse except for the output terminal 3 where a square wave becomes "high" by a reference pulse and "low" by the end of one period of a sawtooth wave received at a Reset terminal thereof are supplied sequentially, a second decade counter 502 which is the same function as the first decade counter 501 except that the beat pulses are received at the terminal 409, exclusive OR circuits 503 to 505 each connected through two input terminals to the corresponding output terminals 1, 2 or 3 of the first and second decade counters 501 and 502, a pulse selection circuit 506 including AND circuits 506A, 506B and 506C and an inverter 506D for selecting the passing of signals from the exclusive OR circuits 503 to 505 therethrough to the next stage, first to third circuits 507A, 507B and 507C each detecting a pulse producing order between the reference pulse and the beat pulse, and a free running multi-vibrator 512 connected to the Reset terminals of the first and second decade counters 501 and 502 and to the sawtooth wave generator 2. Each of the first to third circuits 507A, 507B and 507C includes a monostable multi-vibrator 508, a polarity reversing circuit 509, and switches 510 and 511 which are turned on and off by outputs of terminals $\overline{Q}$ and Q of the monostable multi-vibrator 508. In the circuit 507A, the multi-vibrator 508 is connected at terminal CD to the pulse selection circuit 506 and at terminal B to the terminal 409. While, in the circuits 507B and 507C, the multi-vibrators 508 are connected at terminals $C_D$ to the pulse selection circuit 506 and at terminals B to the output terminals 1 and 2 of the second decade counter 502 respectively.

Figure 6:
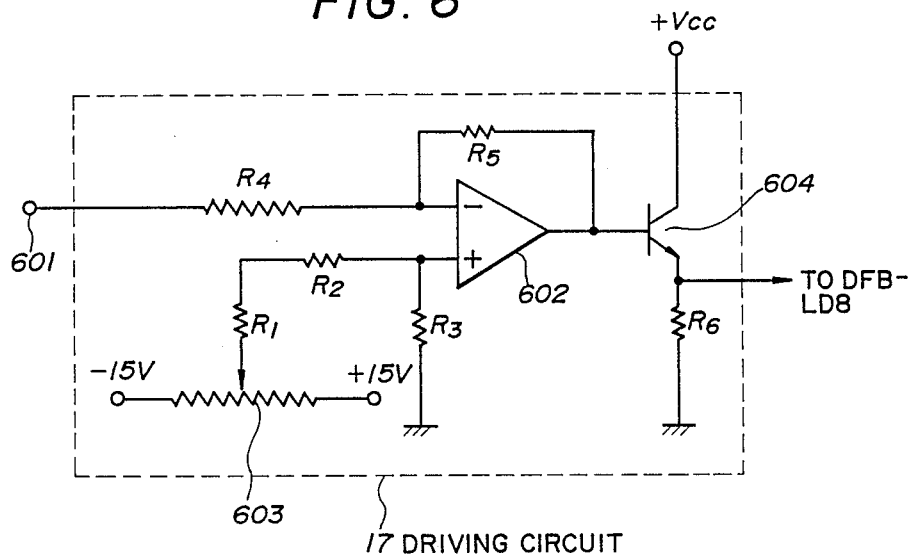
FIG. 6 is a circuit diagram showing a driver for the DFB-LD in the first embodiment.

FIG. 6 shows the laser device driving means 17 for driving the DFB-LD 8 in accordance with the output of the integrating circuit 411 received at a terminal 601. The laser device driving means 17 comprises an operational amplifier 602 having a positive terminal connected through resistances $R_1$ and $R_2$ to a reference voltage means 603 and through a resistance $R_3$ to the ground and a negative terminal connected through a resistance $R_4$ to the terminal 601 and to a feedback resistance $R_5$, and a driving transistor 604 with a base connected to the operational amplifier 602, a collector connected to a power source $+Vcc$, and an emitter connected to the DFB-LD8 and through a resistance Rs to the ground.

Figure 7A:
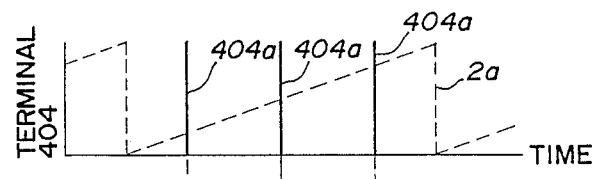
FIGS. 7A to 7M are timing charts showing an operation in the first embodiment.
Figure 7B:
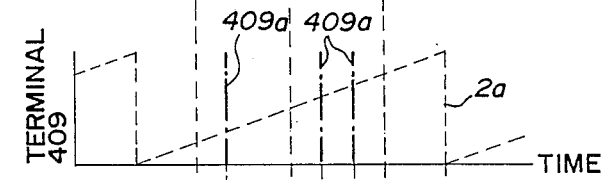

In operation, the wavelength tunable laser device 1 is driven with current $I_a$ injected into the active region 201 which includes a bias current of 50 mA and a sawtooth wave current 2a (as shown in FIGS. 7A and 7B) having a repetition frequency of 500 Hz and a current range of 0 to 5.4 mA supplied from the sawtooth wave generator 2, and with current $I_t$ injected into the PC and DBR regions 202 and 203 which includes only a sawtooth wave current 2a having the same repetition frequency and current range as those for the active region 201 so that a sweep of an oscillation wavelength is performed in the wavelength tunable laser device 1 by a width of 45 GHz, and the injection of the sawtooth wave current 2a into the wavelength tunable laser device 1 compensates an absorption loss which is induced in the PC and DBR regions 202 and 203 by the injection of the sawtooth wave current 2a thereinto and refrain from the fluctuation of output light radiated from the wavelength tunable laser device 1. The output light of the wavelength tunable laser device 1 is passed through the isolator 3 and then divided to be propagated through the optical fiber 5A and 15A by the optical divider 4. The output light of the optical fiber 5A is supplied to the Fabry Perot optical resonator 5 so that the three output lights of pulses are produced in one period of the sawtooth wave when an oscillation frequency of the wavelength tunable laser device 1 coincides with the three resonant frequencies of the resonator 5. For three output lights thus produced are converted in the optical detector 6 to the three electric signals which are then supplied to the terminals 71 of the control unit 7. Simultaneously, the DFB-LDs 8, 9 and 10 are driven to radiate output lights which are passed through the isolators 11, 12 and 13 by the driving means 17, 18 and 19 respectively. The output lights passed through the isolators 11, 12 and 13 are propagated through the optical fibers 14A, 14B and 14C and then combined in the first optical coupler 14. The light supplied from the first optical coupler 14 is propagated through the optical fiber 15B and then combined in the second optical coupler 15 with the light supplied from the optical fiber 15A. The combined lights are propagated through the optical fiber 16A and then converted in the second detector 16 to electric signals which are applied to the terminal 72 of the control unit 7.

In the control unit 7, the electric signals of pulses received at the input terminal 71 from the first optical detector 6 are amplified in the low-pass amplifier 401 and then converted in the Schmitt trigger circuit 402 to the logic signals. The polarity of the logic signals is inverted to be applied to the input terminal 404 of the circuit 410. The inverted logic signals are called "the first to third reference pulses 404a" as shown in FIG. 7A. The electric signals received at the input terminal 72 from the second optical detector 16 are supplied to the low-pass amplifier 405 in which the three electric signals of pulses are produced to be beat signals when the difference of frequencies between the output light of the wavelength tunable laser device 1 and the output lights of the DFB-LDs 8, 9 and 10 is in the range of ±600 MHz so that the three pulses are obtained therein. The three pulses are subject to an envelope detection in the envelope detector 406 and then converted in the Schmitt trigger circuit 406 to the logic signals which are then inverted in the inverter 408. The inverted logic signals are applied to the input terminal 409 of the circuit 410 and shown to be "the first to third beat signals 409a" in FIG. 7B.

Figure 7C:
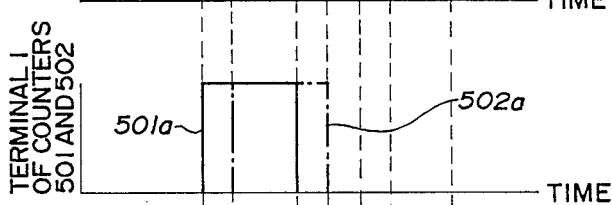
Figure 7D:
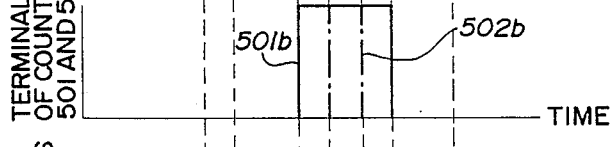
Figure 7E:
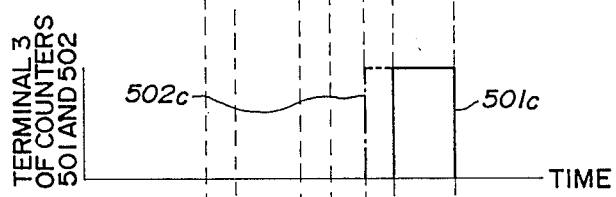
Figure 7F:
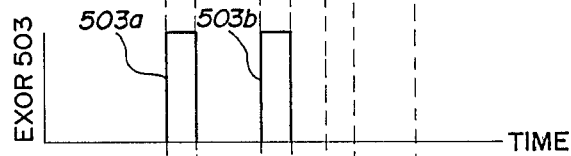
Figure 7G:
Figure 7H:
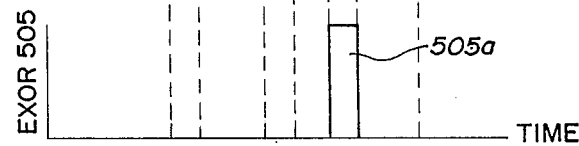

In the circuit 410, the first to third reference pulses 404a are applied to the decade counter 501, and the first to third beat pulses 409a are applied to the decade counter 502. In the decade counter 501, the first square wave 501a is produced at the terminal 1 during the time interval between the first and second reference pulses 404a as shown in FIG. 7C, the second square wave 501b is produced at the terminal 2 during the time interval between the second and third reference pulses 404a as shown in FIG. 7D, and the third square wave 501C is produced at the terminal 3 during the time interval between the third reference pulse 404a and the start of the next sawtooth wave signal 2a as shown in FIG. 7E. In the same manner, the first to third square waves 502a, 502b and 502c are produced at the terminals 1, 2 and 3 in accordance with the first to third beat pulses 409a and the sawtooth wave signal 2a as shown in FIGS. 7C, 7D and 7E. Outputs of the terminals 1 of the decade counters 501 and 502 are supplied to the exclusive OR circuit 503, and those of the terminals 2 and 3 of the decade counters 501 and 502 are supplied to the exclusive OR circuits 504 and 505 respectively. Outputs of those exclusive OR circuits 503, 504 and 505 produced in the following truth table are shown in FIGS. 7F to 7H by reference numerals 503a, 503b, 504a, 504b and 505a, and supplied to the pulse selection circuit 506.

| INPUT | | OUTPUT |
|---|---|---|
| 0 | 0 | 0 |
| 0 | 1 | 1 |
| 1 | 0 | 1 |
| 1 | 1 | 0 |

Figure 7I:
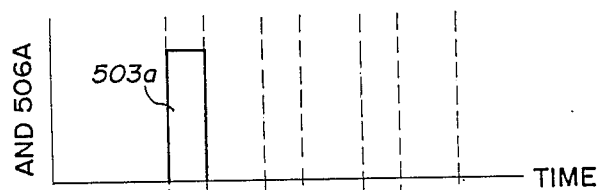
Figure 7J:
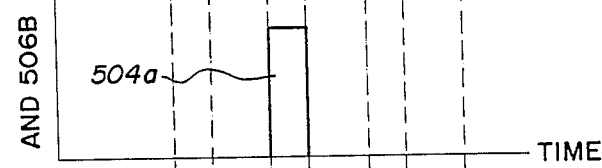
Figure 7K:
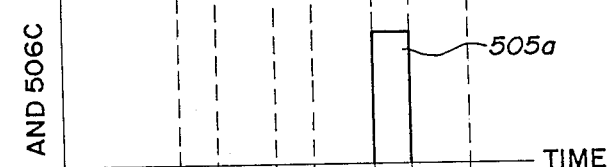
Figure 7L:
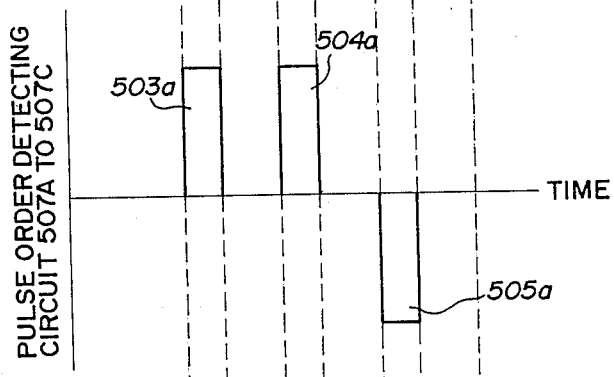
Figure 7M:
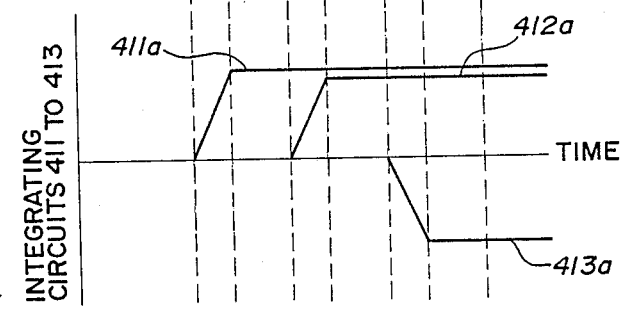

In the first AND circuit 506A, the pulse 503a is passed therethrough, while the pulse 503b is stopped to be passed therethrough as shown in FIG. 7I. That is, the first AND circuit 506A in a case where the pulses 503a and 503b are supplied thereto. In the same manner, only the pulse 504a is passed through the second AND circuit 506B as shown in FIG. 7J, while the single pulse 505a is passed through the third AND 506C as shown in FIG. 7K. The pulses 503a, 504a and 505a thus passed through the pulse selection circuit 506 are supplied to the first to third pulse order detecting circuits 507A, 507B and 507C. In the first pulse order detecting circuit 507A, the switch 510 is turned on, and the switch 511 is turned off for the reason why the terminals Q and $\overline{Q}$ of the multivibrator 508 are "low" and "high" respectively, and a signal applied to the terminal B thereof is "low" when the pulse 503a is applied to the terminal $C_D$ thereof so that the pulse 503a is supplied through the switch 510 to the integrating circuit 411 as shown in FIG. 7L. When the pulse 503a becomes "low", the first beat pulse 409 is applied to the terminal B of the multivibrator 508. This means that a pulse is passed through the pulse order detecting circuit 507A when the first reference signal 404a is produced earlier than the first beat signal 409a, while a pulse is inverted to be passed therethrough when the first reference signal 404a is produced later than the first beat signal 409a. In the second pulse order detecting circuit 507B, the pulse 504b is passed therethrough without being inverted, as shown in FIG. 7L, because the square wave signal 502a (as shown in FIG. 7C) becomes "low" when the pulse 504b becomes "low". In the third pulse order detecting circuit 507c, the pulse 505a is inverted to be passed therethrough as shown in FIG. 7L for the reason why the square wave signal 502b is applied to the terminal B of the multivibrator 508 before the pulse 505a is applied to the terminal $C_D$ thereof so that the switch 510 is turned off, and the switch 501 is turned off when the square wave signal 502b becomes "low". The non-inverted pulses 503a and 504a and the inverted pulse 505a are integrated in the integrating circuits 411 to 413 during each two or three periods of the sawtooth waves a respectively to provide integrated values 411a, 412a and 413a as shown in FIG. 7M. The integrated values 411a, 412a and 413a are applied to the driving means 17, 18 and 19 respectively. In the driving means 17, the integrated value 411a is applied to the terminal 601 thereof so that the operational amplifier 602 controls the driving transistor 604 to drive the DFB-LD8 in accordance with the difference between the integrated value 411a and the reference value obtained from the reference voltage means 603. As a result, the DFB-LD8 is driven by the driving current supplied from the driving transistor 604 which is added to a biased current. This means that the DFB-LD 8, 9 and 10 are controlled to radiate output lights having a predetermined frequency separation thereby minimizing the time difference between the aforementioned reference and beat pulses. As clearly understood from the above descriptions, a frequency separation is stabilized strictly in the same value as a free-spectrum range of the optical resonator among a plurality of laser devices.

The operation as described above will be summarized as follows.

A sweep of an oscillation frequency of a wavelength tunable laser device is performed to produce a frequency-sweep light in a frequency range including oscillation frequencies of a plurality of laser devices by applying an external signal to the wavelength tunable laser device. The frequency sweep light is passed through an optical resonator having periodic resonant frequencies of a frequency interval equal to a predetermined frequency separation of the oscillation frequencies so that the frequency-sweep light thus passed therethrough is changed in its intensity to produce light signals of pulses which are converted to electric signals of pulses. The electric signals are called to be a train of "reference pulses". Each of the reference pulses is produced in a case where a frequency of the frequency-sweep light coincides with a corresponding one of the resonant frequencies. For this reason, the producing times of the reference pulses correspond to the resonant frequencies of the optical resonator. Simultaneously, the frequency-sweep light is combined with output lights radiated from the plurality of laser devices to produce beat lights which are then converted to electric signals. The converted electric signals are passed through a low-pass filter to produce a train of beat pulses which are to be produced when a frequency of the frequency-sweep light coincides approximately with a corresponding one of the oscillation frequencies of the laser devices. For this reason, producing times of the beat pulses correspond approximately to the oscillation frequencies of the laser devices. For the purpose of stabilizing a frequency separation, each of the beat pulses is compared in regard to producing times with a corresponding one of the reference pulses to produce error signals having a pulse width depending on a time difference between the beat and reference pulses. An oscillation frequency is controlled in each of the laser devices such that each of the error signals becomes a predetermined value. Consequently, an oscillation frequency is stabilized in each of the laser devices based on a resonant frequency separation of the optical resonator.

Figure 9:
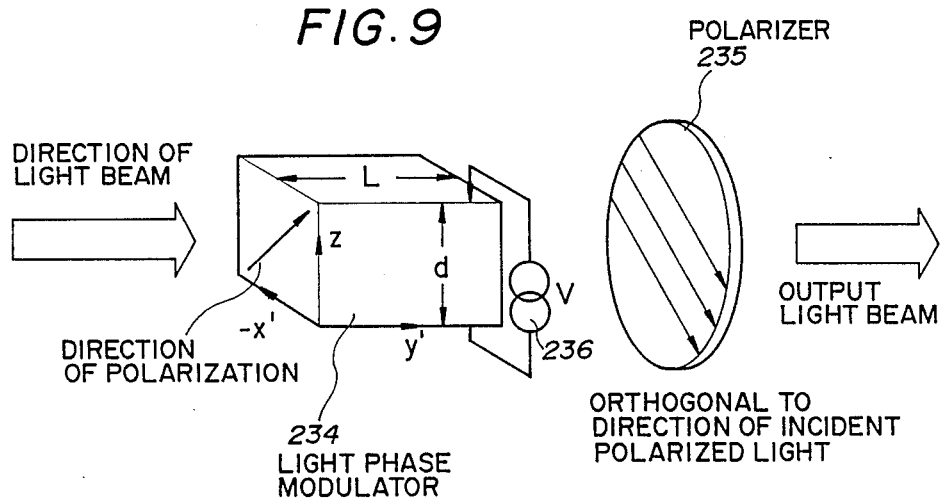
FIG. 9 is an explanatory diagram showing an optical amplitude modulator in the second embodiment.

In FIG. 8, there is shown an apparatus for stabilizing an oscillation frequency separation among a plurality of laser devices in a second embodiment according to the invention wherein like parts are indicated by like reference numerals in the first embodiment so that repeated explanations are omitted here. The apparatus for stabilizing an oscillation frequency separation among a plurality of laser devices further comprises optical amplitude modulators 231, 232 and 233 each including an optical phase modulator 234 having a length L and a thickness d and a polarizer 235 which are longitudinally arranged as shown in FIG. 9. In the optical phase modulator 234 and the polarizer 235, the directions of polarized lights are orthogonal to each other as indicated by arrows, and a predetermined voltage is applied from a power source 236 to the optical phase modulator 234. In the construction thereof, output lights of DFB-LDs 8, 9 and 10 are modulated in the optical amplitude modulators 231, 232 and 233 at 1 KHz, 2 KHz and 3 KHz by sinusoidal waves. Such an optical amplitude modulator has been described in detail in Chapter 9 of "Introduction to optical electronics", 1971, authored by Amnon Yariv which is published from Holt, Rinehart and Winston Inc.

Figure 10:
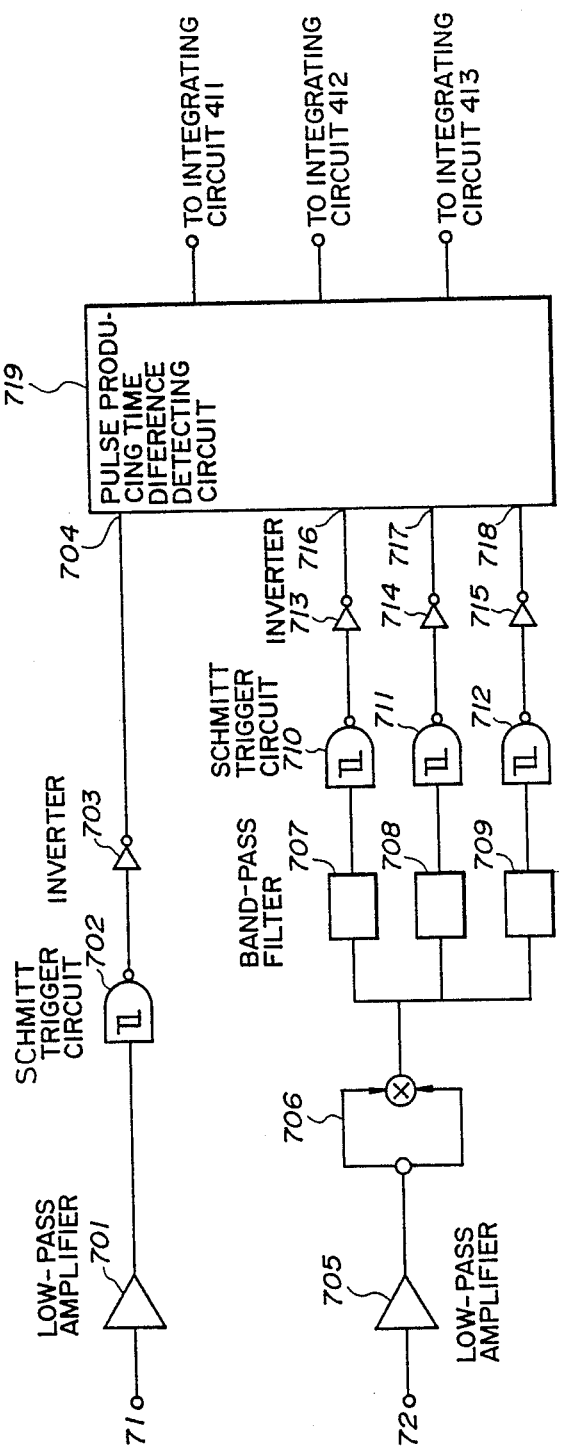
FIG. 10 is a block diagram showing a control unit in the second embodiment.

FIG. 10 shows a control unit 7 as shown in FIG. 8. In the control unit 7, electric signals of pulses supplied from a first optical detector 6 to the terminal 71 are amplified in a low-pass amplifier 701 and then converted in a Schmitt trigger circuit 702 to logic signals each having an amplitude of a logic level. The polarities of the logic signals are inverted in an inverter circuit 703 to be supplied to an input terminal 704 of a circuit 719 for detecting a pulse producing time difference. The number of the logic signals received at the terminal 704 is three in one period of a sawtooth wave produced in a sawtooth generator 2, and the logic signals are called to be "first to third reference pulses". Simultaneously, electric signals are supplied through a terminal 72 of the control unit 7 to a low-pass amplifier 705 having a function of a low-pass filter with a cut-off frequency of 600 MHz. In the low-pass amplifier 705, electric signals of pulses are produced when a frequency difference between output light of a wavelength tunable laser device 1 and output lights of laser devices 8, 9 and 10 is in a range of approximately ±600 MHz. The number of the pulses is three in one period of the sawtooth wave, and the pulses are called to be "first to third beat pulses". The pulses are subject to an envelope detection in an envelope detector 706, and then divided into three signals to be supplied to band-pass filters 707, 708 and 709 having a band-pass width of 100 Hz in the respective center frequencies of 1 KHz, 2 KHz and 3 KHz. The signals thus passed through the band-pass filters 707, 708 and 709 are shaped in Schmitt trigger circuits 710, 711 and 712 to be square waves each having an amplitude of a logic level and then inverted in inverters 713, 714 and 715. The logic signals thus obtained are supplied to terminals 716, 717 and 718 of the pulse producing time difference detecting circuit 719.

Figure 11:
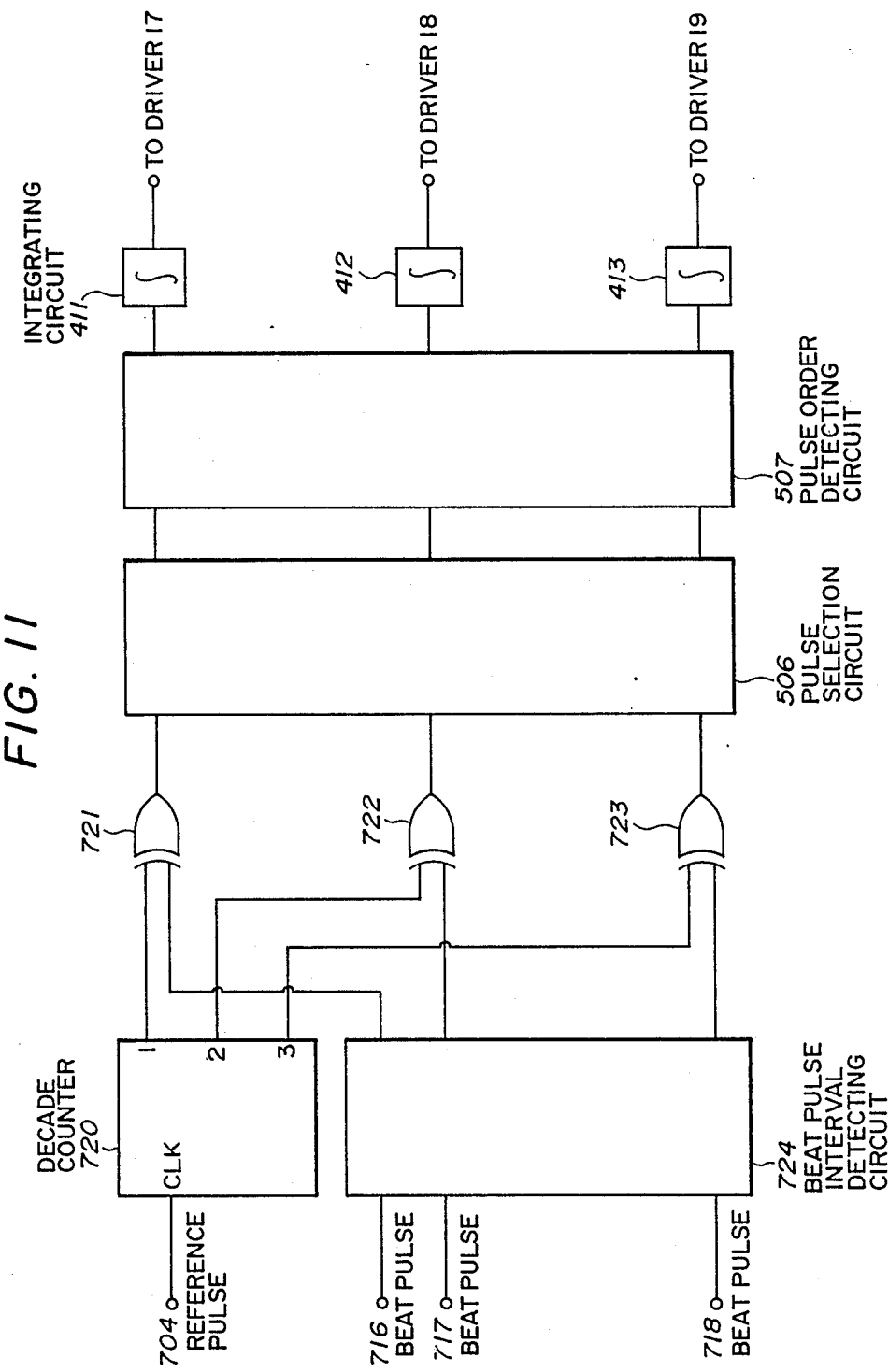
FIG. 11 is a block diagram showing a block diagram showing a circuit for detecting the difference of pulse producing times.
Figure 12A:
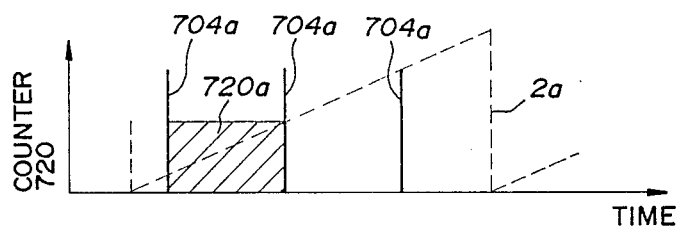
FIGS. 12A to 12I are timing charts showing an operation in the second embodiment.
Figure 12B:
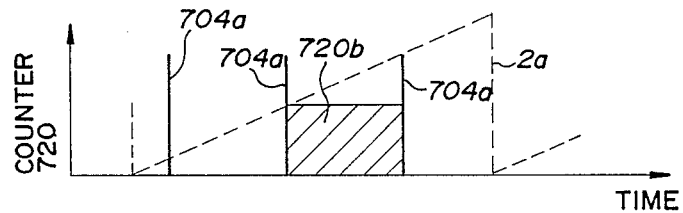
Figure 12C:
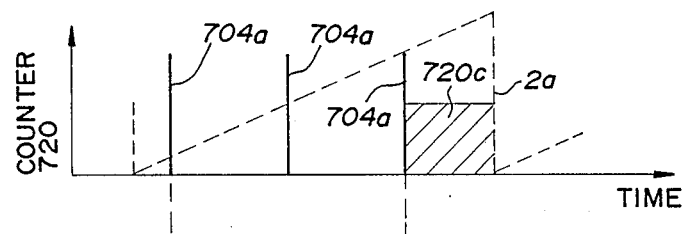
Figure 12D:
Figure 12E:
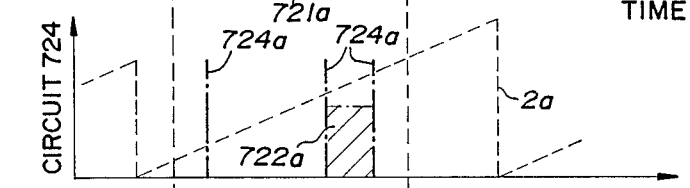
Figure 12F:
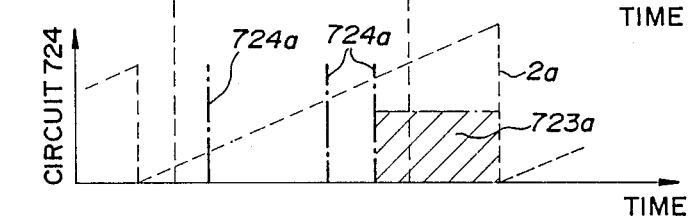
Figure 12G:
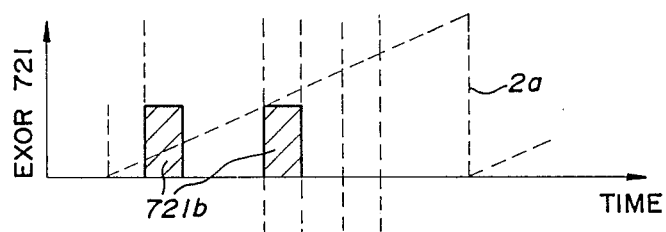
Figure 12H:
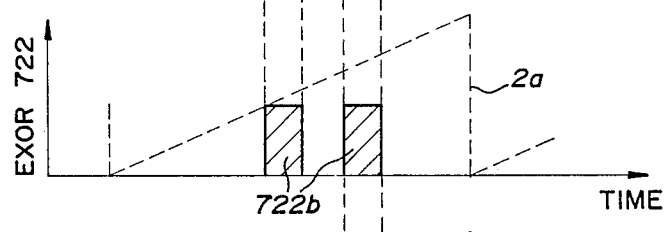
Figure 12I:
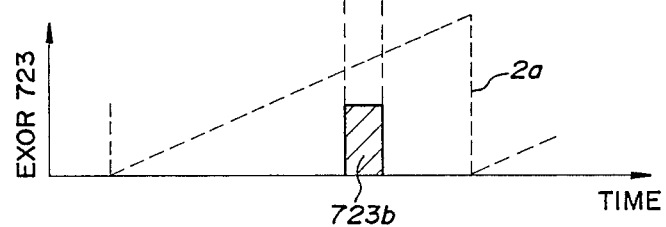

FIG. 11 shows the pulse producing time difference detecting circuit 719 as shown in FIG. 10. In the circuit 719, a train of the reference pulses 704a are applied through the terminal 704 to a CLK terminal of a counter 720 so that first to third square waves 720a to 720c are produced at terminals 1 to 3 of the counter 720, respectively, in accordance with the reference pulses 704a and the sawtooth wave 2a as shown in FIGS. 12A to 12C. The first and second square waves 720a and 720b are defined by intervals of the first to third reference pulses 704a, while the third square wave 720c is defined by an interval of the third reference pulse and the start of the next sawtooth wave 2a. The first to third square waves 720a to 720c are applied to exclusive OR circuits 721 to 723 respectively. On the other hand, the first to third beat pulses 724a as shown in FIGS. 12D to 12F are supplied through the terminals 716 to 718 to a beat pulse producing time difference detecting circuit 724 from which square waves 721a to 723a as shown in FIGS. 12D to 12F are supplied to the exclusive OR circuits 721 to 723. As a result, outputs 721b to 723b as shown FIG. 12G to 12I are produced in the exclusive OR circuits 721 to 723 respectively. The outputs 721b to 723b are supplied to a pulse selection circuit 506, thereafter to a pulse order detecting circuit 507 which are already explained in the first embodiment. Therefore, the explanations thereof are omitted here.

As described above, output lights radiated from a plurality of laser devices to be controlled in regard to an oscillation frequency separation are modulated by respective different frequencies in the second embodiment. As a result, beat pulses thus modulated are supplied to a control unit in which the modulated beat pulses are discriminated thereamong so that a corresponding relation between a selected one of the modulated beat pulses and that of the laser devices can be detected. Accordingly, if modulating frequencies of the output lights are exchanged among the laser devices, the above mentioned corresponding relation can be exchanged so that respective oscillation frequencies of the laser devices can be exchanged as well. Further, capture range can be widened to the sweep range of the frequency sweep laser device.

Figure 14A:
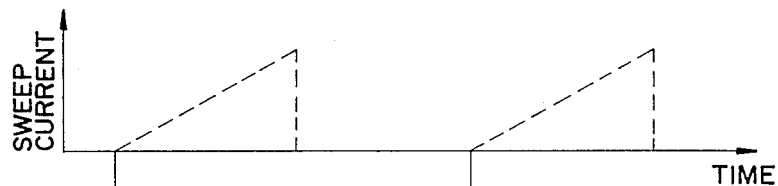
FIGS. 14A and 14B are waveforms of sweep currents flowing through a wavelength tunable laser device in the third embodiment.
Figure 14B:
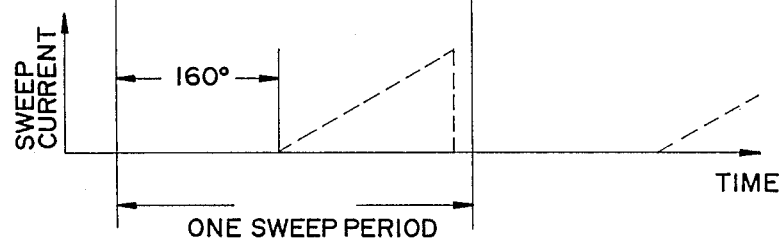
Figure 13:
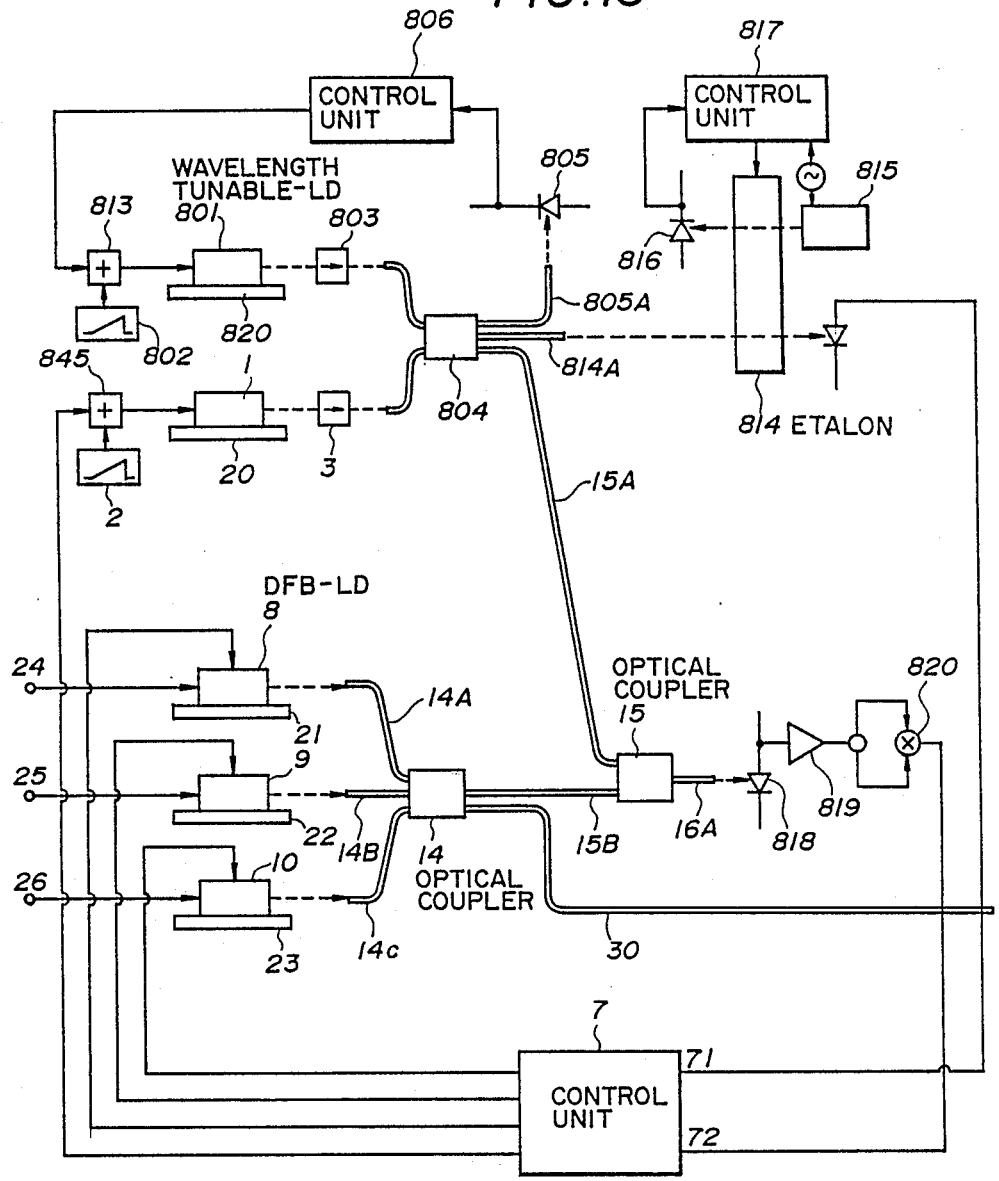
FIG. 13 is a block diagram showing a third embodiment according to the invention.

In FIG. 13, there is shown an apparatus for stabilizing an oscillation frequency separation among a plurality of laser devices in a third embodiment according to the invention in which like parts are indicated by like reference numerals in the first embodiment so that repeated explanations are omitted here. In the third embodiment, two wavelength tunable laser devices 1 and 801 are adopted to radiate two frequency-sweep lights which are passed through isolators 3 and 803 in accordance with injected currents $I_a$ and $I_t$ which are supplied to an active region thereof and a PC and DBR regions thereof. The currents $I_a$ and $I_t$ are sawtooth waves each being produced intermittently and having a maximum value of 2.7 mA as shown in FIGS. 14A and 14B. FIG. 14A shows a sweep current for the wavelength tunable laser device 1, and FIG. 14B shows a sweep current for the wavelength tunable laser device 801 mounted on a temperature controlling means 820. The both sweep currents have a phase difference of 160° therebetween. An oscillation frequency of the wavelength tunable laser device 1 which is at the end of a sweep period is equal to that of the wavelength tunable laser device 801 which is at the start of a sweep period. The output lights of the wavelength tunable laser devices 1 and 801 are passed through isolators 3 and 803, and combined and then divided in an optical coupling and dividing means 804 having two inputs and three output into a first to third output lights. The first output light passed through an optical fiber 805A is converted in an optical detector 805 to electric signals which are supplied to a control unit 806.

Figure 15:
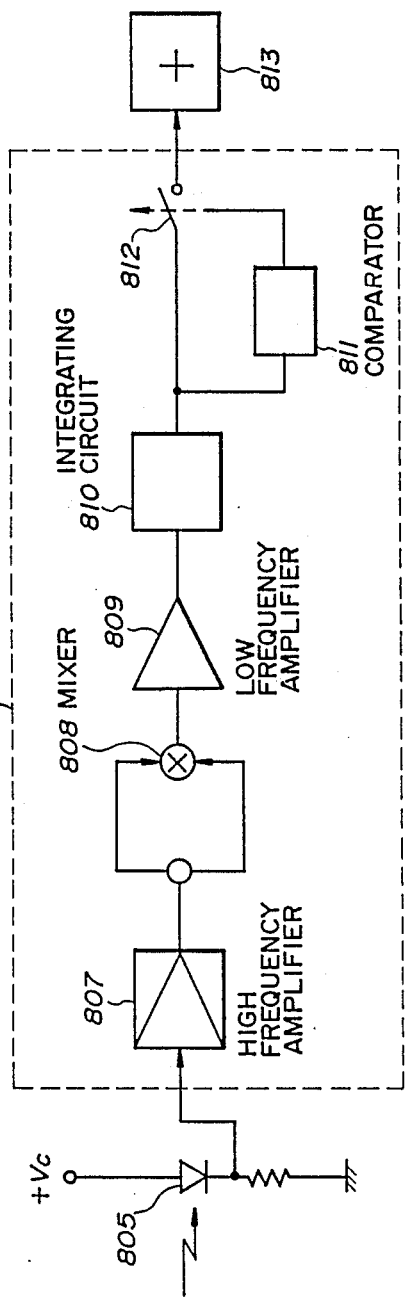
FIG. 15 is a block diagram showing a control unit in the third embodiment.
Figure 16:
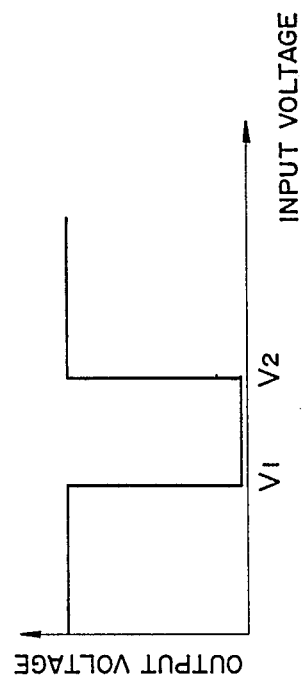
FIG. 16 is an explanatory diagram showing an input-output property of a comparator in the third embodiment.

FIG. 15 shows the control unit 806 in which the electric signals supplied from the optical detector 807 are amplified in a high frequency amplifier 807 and then envelope-detected in a mixer 808. In the mixer 808, an electric signal of pulse is produced when oscillation frequencies of the wavelength tunable laser devices 1 and 801 coincide with each other. A width of the pulse is of a time during which the oscillation frequencies are equal to each other. In the control unit 806, further, output of the mixer 808 is amplified in a low-pass filter 809 and then integrated in an integrating circuit 810 to detect the time corresponding to the pulse width. The integrated value is compared in a comparator 811 with predetermined voltages $V_1$ and $V_2$ as shown in FIG. 16. A switch 812 is turned on when the integrated value is lower than the voltage $V_1$ or higher than the voltage $V_2$ thereby closing a control loop so that the output of the integrating circuit 810 is supplied to an adder 813 in which the integrated value is added to a sawtooth wave supplied from a sawtooth generator 802. FIG. 16 shows an output voltage along the vertical axis for controlling the switch 812 to be turned on and off in regard to an input voltage from the integrating circuit 810 along the horizontal axis. In accordance with the control described above, there is obtained a predetermined constant time during which an oscillation frequency of the wavelength tunable laser device 1 which is in the vicinity of the maximum value of a sawtooth wave is equal to an oscillation frequency of the wavelength tunable laser device 801 which is in the vicinity of the minimum (starting) value of a sawtooth value. Consequently, the use of more than two wavelength tunable laser devices provides an expanded range of a frequency-sweep without inviting a discontinuity of a frequency-sweep.

The second output of the optical coupling and dividing means 804 is propagated through an optical fiber 814A to be passed through an etalon 814 in which a frequency change of a passing light is converted to a light intensity change. A free spectral range of the etalon 814 is stabilized in a following procedure. At first, a frequency modulation (FM) is applied to a semiconductor laser device 815 which is under an oscillation in a wavelength to be absolutely stabilized (an absolute value of an oscillation frequency is stabilized) at one of ammonia absorption lines. Secondly, output light radiated from the semiconductor laser device 815 is passed through the etalon 814. Thirdly, the output light passed through the etalon 814 is converted in an optical detector 816 to electric signals. Fourthly, a synchronous detection of the electric signals thus obtained is performed in a control unit 817 by modulation waves of the above mentioned frequency modulation. Finally, output of the synchronous detection is controlled to be "zero" in the control unit 817 by adjusting a temperature of the etalon 816. In accordance with the above described control, a frequency at which an intensity of light passed through the etalon 814 becomes a peak value is absolutely stabilized at one of the ammonia absorption lines, because result of synchronous detection of the above electric signals is equal to zero when the center frequency of the laser 815 coincides with resonant frequency of the etalon 816, thus making the above electric signals frequency-doubled. Consequently, the free spectral range is absolutely stabilized.

The third output light of the optical coupling and combining means 804 which is propagated through an optical fiber 15A is combined in an optical coupler 15 with output lights of DFB-LDs 8, 9 and 10 to be controlled. Output lights thus combined are converted in an optical detector 818 to electric signals which are then amplified in a high frequency amplifier 819 having a band-pass width of 1 GHz. Beat pulses which are obtained in an envelope detector 820 from the output of the high frequency amplifier 819 are of single-humped shapes because the high frequency amplifier 819 has a band-pass width as wide as 1 GHz, in spite of the fact that a frequency shift keying modulation is performed in the DFB-LDs 8, 9 and 10 so that spectrums thereof are of double-humped shapes. For this reason, an error can be avoided in the above described control.

Figure 17:
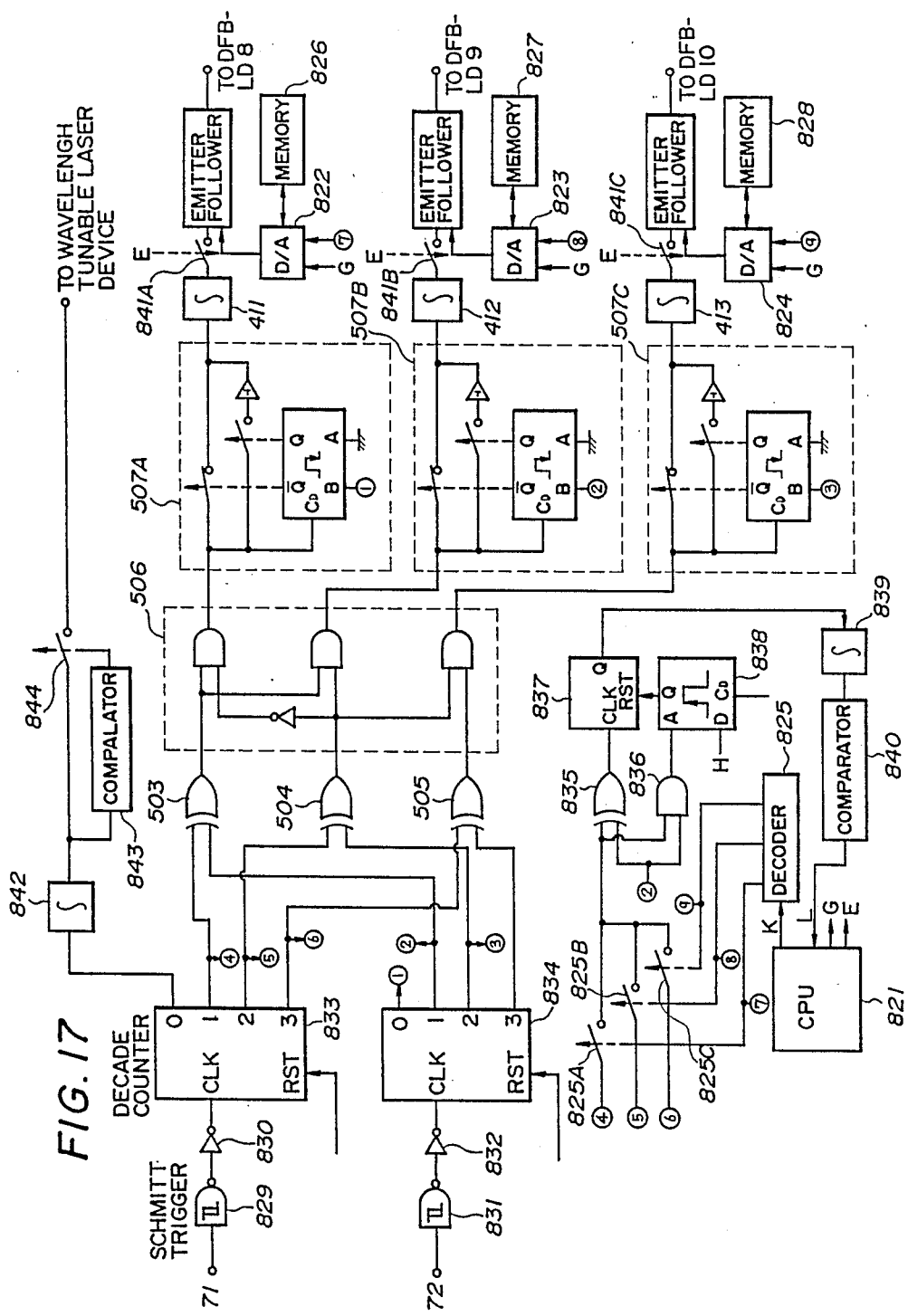
FIG. 17 is a block diagram showing a control unit is the third embodiment.
Figure 18:
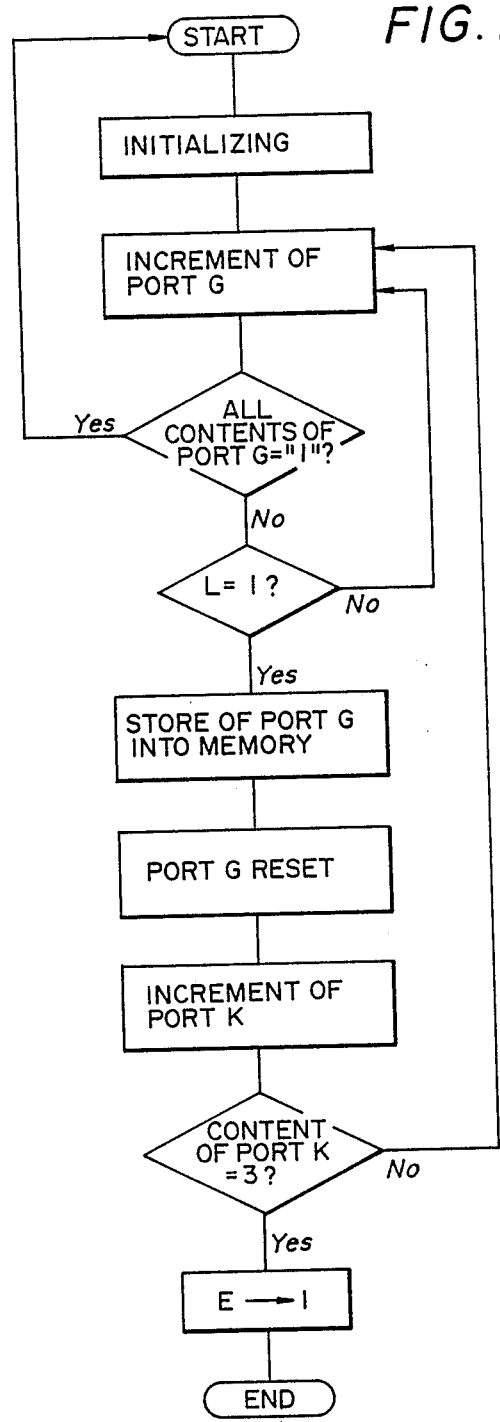
FIG. 18 is a flow chart showing an operation in the third embodiment.

FIG. 17 shows a control unit 7 as shown in FIG. 13, and FIG. 18 shows a flow chart of operation which is controlled by a Central Processing Unit (CPU) 821 in the control unit 7. In the control sequence, a power source is turned on to initialize the CPU 821, and current injected into a DFB-LD 8 which is one of DFB-LDs 8, 9 and 10 to be controlled is increased in each step by 0.5 mA. A selection of a laser device from the DFB-LD 8, 9 and 10 is performed based on a selection of a D/A converter from D/A converter 822 to 824 which is performed based on signals produced at a port K of the CPU 821 by a decoder 825. The increase of the injected current is conducted in accordance with an output of a D/A converter thus selected to which an output of a counter included in the CPU 821 is applied. In a case where a time difference between a reference pulse and a beat pulse is more than a predetermined value, the injected current is increased by a current amount of one step, that is, 0.5 mA. On the other hand, when the time difference becomes less than the predetermined value, the injected current is stopped to be increased and a value of the current thus controlled is stored in a corresponding one of memories 826 to 828, that is, the memory 826 for the DFB-LD 8. The time difference is detected as follows. That is, a train of reference pulses are supplied from the terminal 71 through a Schmitt trigger circuit 829 and an inverter 830 to a decade counter 833, and a train of beat pulses are supplied from the terminal 72 through a Schmitt trigger circuit 831 and an inverter 832 to a decade counter 834. Output at a terminal 1 of the decade counter 834 and output at a terminal 1 of the decade counter 833 (which is a terminal selected from terminals 1, 2 and 3 by the decoder 825) are supplied, through a switch 825A turned or by the decoder 825, to an exclusive OR circuit 835 and an AND circuit 836. Output of the exclusive OR circuit 835 is supplied to a T-flip flop 837, and that of the AND circuit 836 is supplied to a monostable multivibrator 838. As a result, a square wave, which becomes "high" when a pulse produced earlier than the other pulse between the reference and beat pulses becomes "high" and which becomes "low" when the other pulse becomes "high", is produced at a terminal Q of the T-flip flop 837. The square wave is then integrated in an integrating circuit 839, and a value integrated therein which is proportional to the time difference is compared in a comparator 840 with a predetermined value.

After the DFB-LD 8 is controlled in the above described manner, and the injected current is stored in the memory 826, the DFB-LD 9 is next controlled to be driven in a manner that an injected current is increased in each step by 0.5 mA. The change of a laser device to be selected from the DFB-LDs 8, 9 and 10 is effective when a value of the port K is increased in the CPU 821 by one. Consequently, the D/A converter 823 is selected in place of the D/A converter 822. Simultaneously, switch 825B is turned on, and output at a terminal 2 of the decade counter 833 is sampled to detect a time difference between a second reference pulse and a beat pulse corresponding thereto. As to the DFB-LD 10, the same control sequence as described above is performed. Thus, initial current values for the DFBLD 8, 9 and 10 are obtained to be injected thereinto respectively. At the present stage, a port E of the CPU 821 becomes "high" so that switches 841A to 841C are turned on to close a control loop in which an oscillation frequency separation is stabilized among the DFB-LDs 8, 9 and 10. For this purpose, exclusive OR circuits 503 to 505, a pulse selection circuit 506, pulse order detecting circuits 507A to 507C, and integrating circuits 411 to 413 are provided in the same circuit pattern as in the first embodiment so that repeated explanations are omitted here.

Figure 19:
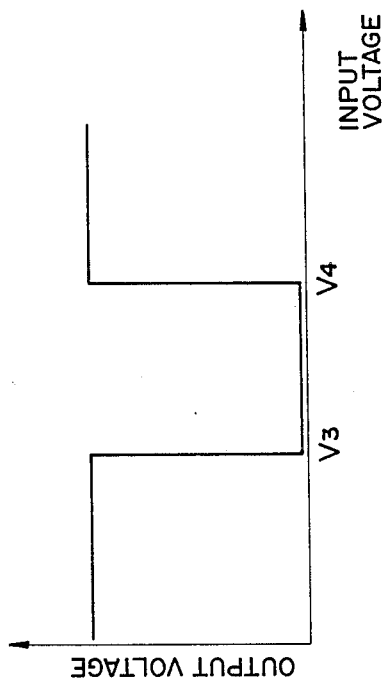
FIG. 19 is an explanatory diagram showing an input-output property of a comparator in the third embodiment.

In the third embodiment, further, output at a terminal 0 of the decade counter 833 is integrated in an integrating circuit 842. The output is a square wave which becomes "high" when a period of an oscillation frequency-sweep is started and becomes "low" when a first reference pulse becomes "high" so that a value integrated in the integrated circuit 842 corresponds to a time difference between a starting time of a frequency-sweep and a first reference pulse. The integrated value is compared in a comparator 843 with predetermined voltages $V_3$ and $V_4$ as shown in FIG. 19. In the comparisons thereof, when the integrated value is less than the voltage $V_3$ or more than the voltage $V_4$, switch 844 is turned on to close a control loop in which the integrated value is added in an adder 845 to a sawtooth wave current supplied from the sawtooth generator 2 to the wavelength tunable laser device 1. As a result, a first reference pulse is fixed at a predetermined time from a starting time of a frequency-sweep so that the vanishing of a first reference pulse can be avoided even if an external disturbance is applied thereto.

As described in the third embodiment, the DFB-LDs 8, 9 and 10 are driven in turn at the start of operation in such a control manner that one of the DFB-LDs 8, 9 and 10 is first driven, and the next one thereof is driven when a beat pulse produced on a basis of output light of the first driven DFB-LD becomes sufficiently near a corresponding reference pulse on a time axis. Therefore, the apparatus in which a frequency separation is stabilized is automatically controlled during an entire controlling sequence from a starting period of stabilizing the frequency separation to a remaining period of controlling a normal operation.

In the third embodiment, further, a time difference between a starting time of a frequency-sweep and a producing time of a reference pulse is controlled to be in a predetermined range. Unless such a control is performed in the wavelength tunable laser device 1, an oscillation frequency is fluctuated due to an external disturbance. Even worse, it is expected that a frequency range of sweeping a transmission property of an optical resonator is fluctuated so that a first reference pulse which is first produced at the top position of a sweep period will be vanished due to the lapse of time. Otherwise, another reference pulse is produced to take a top position of the sweep period in such an occasion. If these are actually occured in a control of a frequency separation, a predetermined control result can not be obtained. An oscillation frequency of the wavelength tunable laser diode 1 is controlled in the above described manner so that the disadvantages described above can be overcome and an operation of the apparatus according to the invention is stably performed.

In the third embodiment, still further, even much higher frequency component of beat signals which are obtained from the combining of a frequency sweep light of the wavelength tunable laser device 1 and output lights of the DFB-LDs 8, 9 and 10 is utilized to produce beat pulses. In this operation, a beat pulse of a single-humped shape is obtained even from light having a re-entrant shape in the vicinity of the peak thereof because a frequency shift keying modulation having a large modulation index is applied to the DFB-LDs 8, 9 and 10. Consequently, a malfunction of the control unit 5 resulted from a beat pulse having a double-humped shape is effectively avoided. In such a case, a beat pulse having a single-humped shape is obtained from light modulated in other modulation methods or from CW light so that it is possible to stabilize a frequency separation by using any arbitrary modulation light.

Figure 21B:
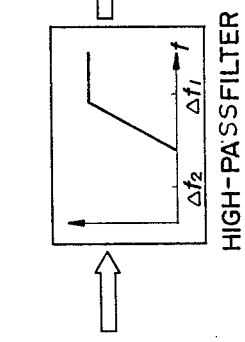
FIGS. 21A to 21C are an explanatory diagram showing operations of a Mach-Zehnderinterferometer and a high-pass filter in the fourth embodiment.
Figure 21A:
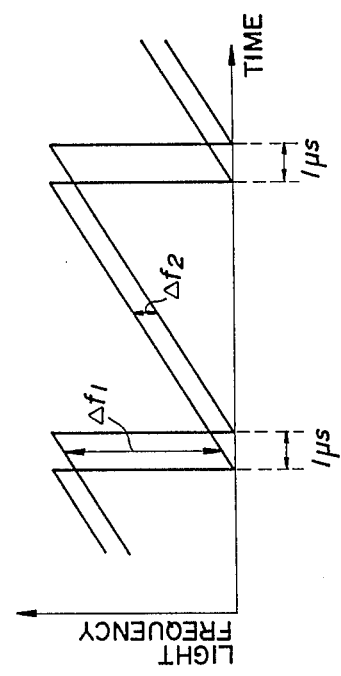
Figure 21C:
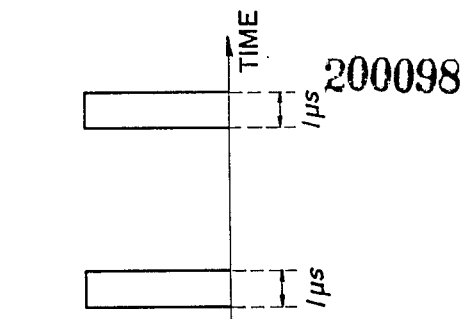
Figure 20:
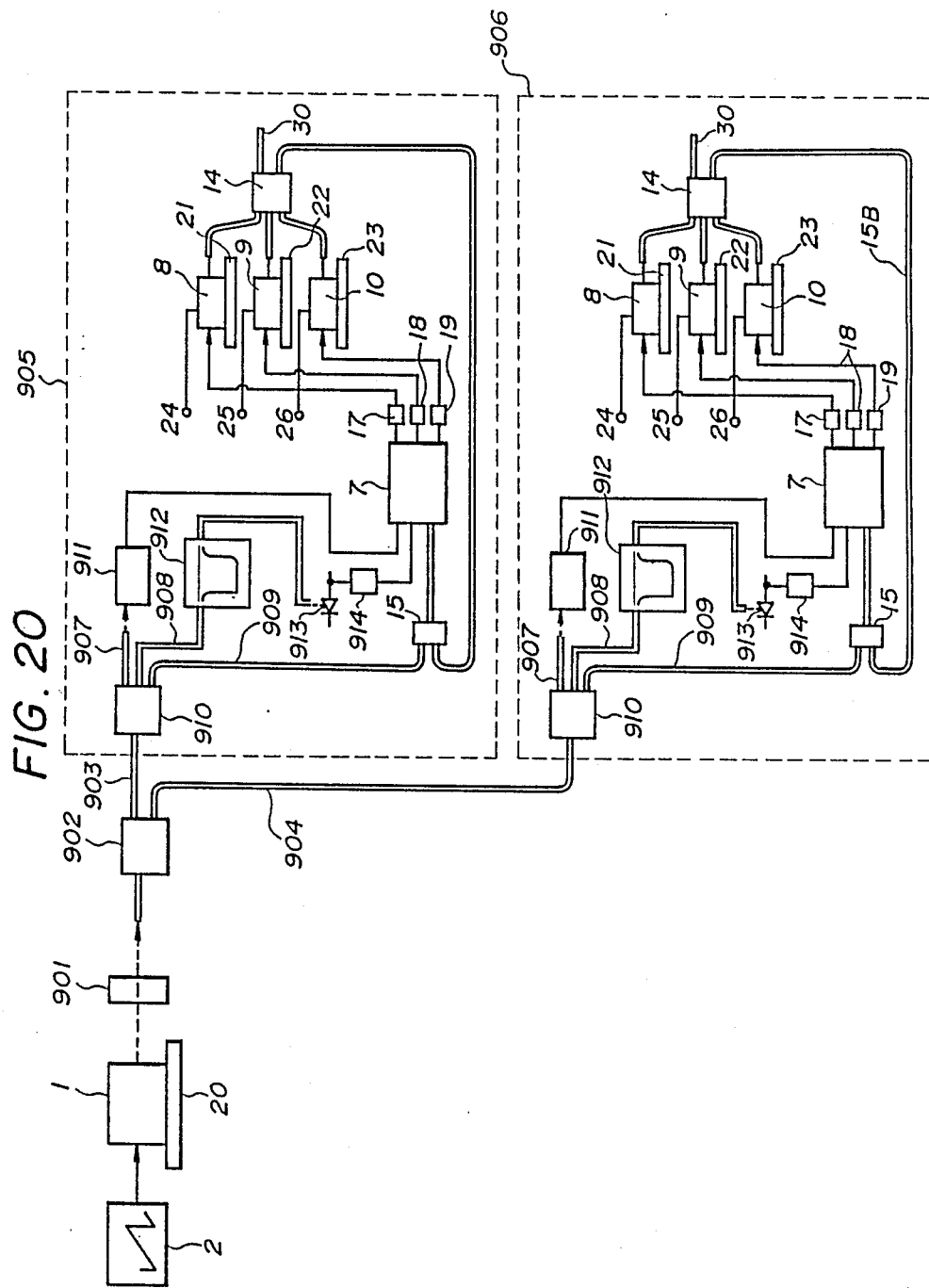
FIG. 20 is a block diagram showing a fourth embodiment according to the invention.

In FIG. 20, there is shown an apparatus for stabilizing an oscillation frequency separation among a plurality of laser devices in a fourth embodiment according to the invention in which like parts are indicated by like reference numerals in FIG. 1 so that repeated explanations are omitted here. In the fourth embodiment, a Fabry-Perot optical resonator composed of an etalon 901 made of quartz having a thickness of 1 cm, a refractive index of 1.5, and a finesse of 1 is adopted for a frequency separation reference. Output light radiated from a wavelength tunable laser device 1 is incident to the etalon 901 without being divided into two lights. Light passed through the etalon 901 is divided into two lights by an optical dividing means 902. The two lights are propagated through optical fibers 903 and 904 to be supplied to two sets of laser device systems 905 and 906 which are of the same construction as each other so that the laser device system 905 is only explained here. In the laser device system 905, light propagated through the optical fiber 903 is divided into three lights to be propagated through optical fibers 907 to 909 by an optical dividing means 910 having an input and three outputs. A first output light propagated through the optical fiber 907 has a small ratio between maximum and minimum values of light intensity in regard to a time depending on a transmission property of the etalon 901. For this reason, the first output light is passed through a peak detecting circuit 911 having a function for producing a narrow pulse at a time of a maximum value thereof so that a train of reference pulses are obtained therein. A second output light propagated through the optical fiber 908 is passed through a Mach-Zehnder interferometer 912 having two transmitting paths between which a transmission delaying time difference of 1 μs is produced therein. Output light of the Mach-Zehnder interferometer 912 includes flat components of a high frequency $\Delta f_1$ during a time period of 1 μs from a starting time of a frequency sweep period for the wavelength tunable laser device 1 and beat components of a low frequency $\Delta f_2$ during a remaining period thereof as shown in FIG. 21A. The output light is converted in an optical detector 914 to electric signal which is supplied to a high-pass filter 914 having a cut-off frequency of 1 GHz as shown in FIG. 21B so that timing pulses for a frequency sweep are obtained to be supplied to a control unit 7 as shown in FIG. 21C. Further, a third output light propagated through the optical fiber 909 is combined in an optical coupler 15 with output lights supplied from the DFB-LDs 8, 9 and 10 so that lights thus combined therein is supplied to the control unit 7 in which beat pulses are produced as described in the former embodiments.

As described above, a frequency sweep light, a train of reference pulses, and timing pulses for a frequency sweep can be propagated through a single optical fiber so that transmission delaying time differences of those lights can be negligible in a case where a stabilization of a frequency separation is performed in a plurality of laser device systems by use of the same frequency sweep light whereby a wavelength synchronism is realized therein. On the contrary, those lights must be propagated through separated cables in a conventional apparatus. For this reason, a number of electric and optical cables must be installed in a narrow space. Further, the above described transmission delaying time differences can not be negligible in a case where the laser device systems are located in remote places.

In other words, when a wavelength synchronism is performed in a plurality of laser device systems by use of a conventional apparatus for stabilizing an oscillation frequency separation, it is needed that timing pulses for applying frequency sweep signals to a wavelength tunable laser device, a frequency sweep light, and a train of reference pulses obtained by passing the frequency sweep light through an optical resonator are supplied to the plurality of laser device systems. In the fourth embodiment, on the other hand, an optical resonator of a low finesse is adopted for a frequency separation reference. Therefore, light passed through the optical resonator of a low finesse is only supplied to the plurality of laser device systems so that the number of signal lines is decreased from three down to one. A train of reference pulses are obtained in a peak detecting circuit to which electric signal converted from the light passed through the optical resonator of a low finesse is supplied in the fourth embodiment. Further, timing pulses for a frequency sweep are obtained in such a manner that one of two-divided lights obtained from the light passed through the optical resonator is delayed to a predetermined extent to be combined with a remaining one of the two-divided lights whereby a beat signal of the combined light includes a high frequency component during a time period at a starting time of which the delayed light is of a frequency of a frequency sweep finishing time and at an ending time of which the non-delayed light is of a frequency of a frequency sweep starting time so that the high frequency component is passed through a high-pass filter to produce the timing pulses. In general, further, a frequency sweep light which is combined with output lights radiated from DFB-LDs to be controlled is described not to be fluctuated in its light power during a frequency sweep. For the purpose, a power fluctuation additionally induced in a frequency sweep light is much less than a predetermined level when the light is passed through an optical resonator of a low finesse. Therefore, an output light passed through such an optical resonator can be used directly for a frequency sweep light. Accordingly, the number of signal lines is decreased down to one as compared to three signal lines which are required in a conventional apparatus.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. A method for stabilizing oscillation frequency separation among a plurality of laser devices comprising,
sweeping the oscillation frequency of a reference semiconductor laser device to which an external signal is applied to radiate a light output whose oscillation frequency varies over a range of frequencies, driving a plurality of semiconductor laser devices to radiate light outputs each at an oscillation frequency in the frequency range of said oscillation frequency sweep of light output from said reference semiconductor laser, combining the frequency swept light output from said reference semiconductor laser and said light outputs from said plurality of semiconductor laser devices to produce combined light signals which are then converted to electric signals, a low frequency component of said electric signals being filtered to produce a train of beat pulses corresponding to said oscillation frequencies of said plurality of laser devices, passing a part of the frequency swept light output from said reference semiconductor laser through an optical resonator having periodic resonant frequencies to produce reference light outputs at said periodic resonant frequencies which are then converted to electric reference pulses, the interval between said periodic resonant frequencies being equal to a predetermined oscillation frequency separation among said plurality of semiconductor laser devices, comparing occurence times of said beat pulses and those of said reference to produce error signals corresponding to the time differences therebetween, and controlling the oscillation frequencies of said plurality of semiconductor laser devices such that said error signals are approximately equal to a predetermined value.

2. A method for stabilizing oscillation frequency separation among a plurality of laser devices according to claim 1, wherein said light outputs radiated from said plurality of laser devices are modulated with respective different frequencies whereby corresponding relations between said beat pulses and said plurality of laser devices are allocated in accordance with modulations of said respective different frequencies.

3. A method for stabilizing oscillation frequency separation among a plurality of laser devices according to claim 1, wherein one of said periodic resonant frequencies of said optical resonator coincides with an oscillation frequency of a frequency-absolutely stabilized laser device in which an absolute value of an oscillation frequency is stabilized.

4. A method for stabilizing oscillation frequency separation among a plurality of laser device according to claim 1, wherein a time difference between a starting time of each period in which said oscillation frequency sweep light output is radiated and a first pulse of said reference pulses in said each period is controlled to be a predetermined constant time.

5. A method for stabilizing oscillation frequency seperation among a plurality of laser devices according to claim 1, wherein a band-pass width through which said beam pulses are passed is approximately equal to a band width which is the same as an expansion of a modulation wave spectrum.

6. An apparatus for stabilizing oscillation frequency seperation among a plurality of laser devices comprising, a reference semiconductor laser device to which an oscillation frequency sweep signal is applied over a frequency range which includes the oscillation frequencies of a plurality of laser devices to be controlled, an optical divider for dividing the light output of said reference semiconductor laser device into at least two light outputs, a first optical coupler for combining light outputs from said plurality of laser devices, a second optical coupler for combining one of said at least two light outputs and the light outputs combined in said first optical coupler, an optical resonator through which the other one of said at least two light outputs is passed to produce transmission light outputs whose intensity levels correspond to said so that reference light outputs are the transmissivity of the optical resonator which varies with frequency to electric reference pulses, means for converting the combined output light obtained in said second optical coupler to an electric signal, a low-pass filter through which a low frequency component of said electric signal is passed to produce beat pulses corresponding to said oscillation frequencies of said plurality of laser devices, means for producing error signals in accordance with the difference of the occurrence times between said reference pulsed and said beat pulses, and means for controlling said plurality of laser devices to be driven in accordance with said error signals such that said error signals become a predetermined value.

7. An apparatus for stabilizing oscillation frequency separation among a plurality of laser devices according to claim 6, wherein said means for driving said plurality of laser devices drives said plurality of laser devices in turn one after another such that the difference of occurrence times is less than a predetermined time in each of said plurality of laser devices.

8. An apparatus for stabilizing oscillation frequency separation among a plurality of laser devices according to claim 6 further comprising, a plurality of oscillation frequency sweep laser devices each having a different oscillation frequency sweep range from the others, an optical coupling and dividing means for combining light outputs radiated from said plurality of oscillation frequency sweep laser devices and dividing light said outputs thus combined into a predetermined number of light outputs means for controlling said plurality of oscillation frequency sweep laser devices to radiate light outputs which partly overlap in said different oscillation frequency sweep range in accordance with one of said predetermined number of light outputs and means for driving said plurality of oscillation frequency sweep laser devices each supplied with an input signal to be varied on the basis of a control signal supplied from said means for controlling.

9. An apparatus for stabilizing oscillation frequency separation among a plurality of laser devices according to claim 6 further comprising,
 a first optical divider for dividing output light radiated from said optical resonator into a predetermined number of light outputs, said optical resonator passing light outputs radiated from an oscillation frequency sweep laser device therethrough,
 said predetermined number of second optical dividers each receiving a corresponding one of said predetermined number of light outputs and dividing said light outputs thus received into at least three light outputs,
 a predetermined number of peak detecting means each receiving one of said at least three light outputs and producing a pulse to be supplied to said means for controlling each time when said one of said at least three light outputs is at maximum value, and
 a predetermined number of Mach-Zehnder interferometers each receiving the other one of said at least three light outputs and applying the output thereof to said means for controlling.

10. An apparatus for stabilizing oscillation frequency separation among a plurality of laser devices according to claim 6 further comprising,
 N optical modulators in which N light outputs radiated from said plurality of laser devices are modulated with N different frequencies respectively, and
 N band-pass filters each including only one of said different frequencies in its band, where N is the number of said plurality of laser devices.

* * * * *

UNITED STATES PATENT AND TRADEMARK OFFICE
CERTIFICATE OF CORRECTION

PATENT NO. : 4,835,782
DATED : May 30, 1989
INVENTOR(S) : KAZUHISA KAEDE ET AL

It is certified that error appears in the above-identified patent and that said Letters Patent is hereby corrected as shown below:

Col. 6, line 59, delete "$R_S$" and insert --$R_6$--.

Col. 8, line 29, after "That is," insert --the earlier producing pulse 503a is only passed through--.

Signed and Sealed this

Twenty-seventh Day of February, 1990

Attest:

JEFFREY M. SAMUELS

*Attesting Officer*  *Acting Commissioner of Patents and Trademarks*